US012660263B2

(12) United States Patent
Lin et al.

(10) Patent No.: US 12,660,263 B2
(45) Date of Patent: Jun. 16, 2026

(54) METHOD OF FORMING SEMICONDUCTOR DEVICE WITH SILICIDE LAYER WITH DIFFERENT SILICIDE PHASES OR DIFFERENT THICKNESSES

(71) Applicant: TAIWAN SEMICONDUCTOR MANUFACTURING COMPANY, LTD., Hsinchu (TW)

(72) Inventors: Ta-Chun Lin, Hsinchu (TW); Yi-Hsien Chen, Hsinchu County (TW); Chi Huang, Changhua County (TW); Chih-Pin Tsao, Hsinchu County (TW); Chun-Sheng Liang, Changhua County (TW); Chih-Hao Chang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 737 days.

(21) Appl. No.: 18/149,571

(22) Filed: Jan. 3, 2023

(65) Prior Publication Data

US 2024/0222431 A1 Jul. 4, 2024

(51) Int. Cl.
H10D 62/10 (2025.01)
H10D 30/67 (2025.01)
H10D 64/01 (2025.01)
H10D 84/01 (2026.01)
H10D 84/03 (2025.01)

(52) U.S. Cl.
CPC ....... H10D 62/121 (2025.01); H10D 30/6729 (2025.01); H10D 30/6757 (2025.01); H10D 64/017 (2025.01); H10D 84/0128 (2025.01); H10D 84/013 (2025.01); H10D 84/038 (2025.01)

(58) Field of Classification Search
CPC .......... H10D 30/6729; H10D 30/6757; H10D 64/017; H10D 84/0128; H10D 84/013; H10D 84/038; H10D 30/0212; H10D 30/6735; H10D 30/797; H10D 62/151; H10D 62/822; H10D 64/251
USPC ....................................... 257/288
See application file for complete search history.

(56) References Cited

U.S. PATENT DOCUMENTS

| | | | | |
|---|---|---|---|---|
| 6,013,551 | A * | 1/2000 | Chen ..................... | H10B 41/30 |
| | | | | 438/296 |
| 6,951,767 | B1 * | 10/2005 | Lin ......................... | H10P 95/00 |
| | | | | 438/719 |
| 8,962,400 | B2 | 2/2015 | Tsai et al. | |
| 9,093,514 | B2 | 7/2015 | Tsai et al. | |
| 9,209,247 | B2 | 12/2015 | Colinge et al. | |
| 9,236,267 | B2 | 1/2016 | De et al. | |
| 9,245,805 | B2 | 1/2016 | Yeh et al. | |

(Continued)

*Primary Examiner* — Caleb E Henry
*Assistant Examiner* — Pratiksha Jayant Lohakare
(74) *Attorney, Agent, or Firm* — Maschoff Brennan

(57) ABSTRACT

A method of forming a semiconductor device includes the following steps. A substrate is patterned to form a fin structure. The fin structure is recessed to form a recess in the fin structure. An epitaxial source/drain region is grown from the recess. A first silicide layer is formed on the epitaxial source/drain region. A first portion of the first silicide layer is thinned, while leaving a second portion of the first silicide layer un-thinned. A metal contact is formed in contact with the thinned first portion of the first silicide layer.

20 Claims, 46 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,418,897 B1 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 9,947,804 B1 * | 4/2018 | Frougier | H10D 30/6743 |
| 11,482,458 B2 * | 10/2022 | Chu | H10D 84/017 |
| 2008/0230848 A1 * | 9/2008 | Yang | H10D 84/038 |
| | | | 257/388 |
| 2009/0294871 A1 * | 12/2009 | Besser | H01L 21/26506 |
| | | | 257/E21.409 |
| 2011/0223736 A1 * | 9/2011 | Lin | H10D 84/038 |
| | | | 438/305 |
| 2015/0206881 A1 * | 7/2015 | Tsai | H10D 84/85 |
| | | | 257/369 |
| 2017/0053916 A1 * | 2/2017 | Ching | H10D 84/853 |
| 2018/0145177 A1 * | 5/2018 | Lin | H10D 30/6211 |
| 2019/0385896 A1 * | 12/2019 | Chiang | H01L 21/7682 |
| 2020/0006556 A1 * | 1/2020 | Huang | H10D 30/603 |
| 2020/0105618 A1 * | 4/2020 | Tsai | H10D 64/0112 |
| 2021/0074814 A1 * | 3/2021 | Stephenson | H01L 21/02507 |

* cited by examiner

10

10

10

136

126

130

127
125

128

134

100

10

150

148

140

128

139

134

100

10

136

126

130

128

127
125

134

100

10

140

128

152

139

134

100

10

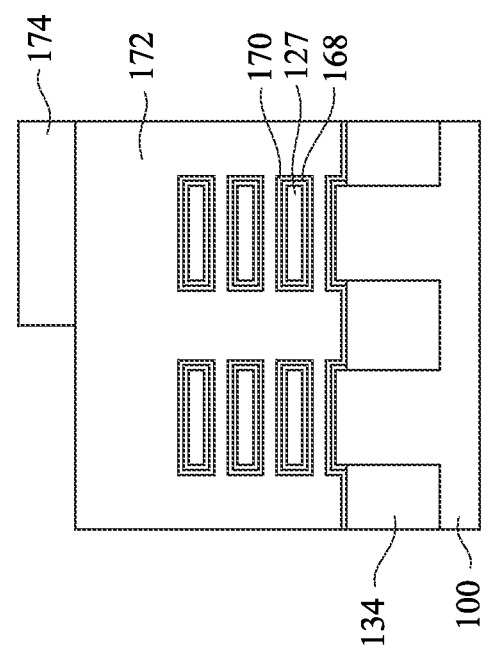
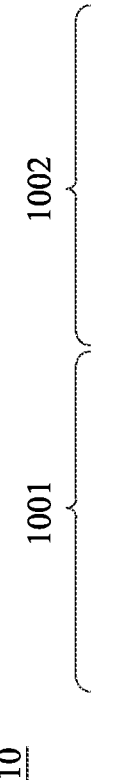
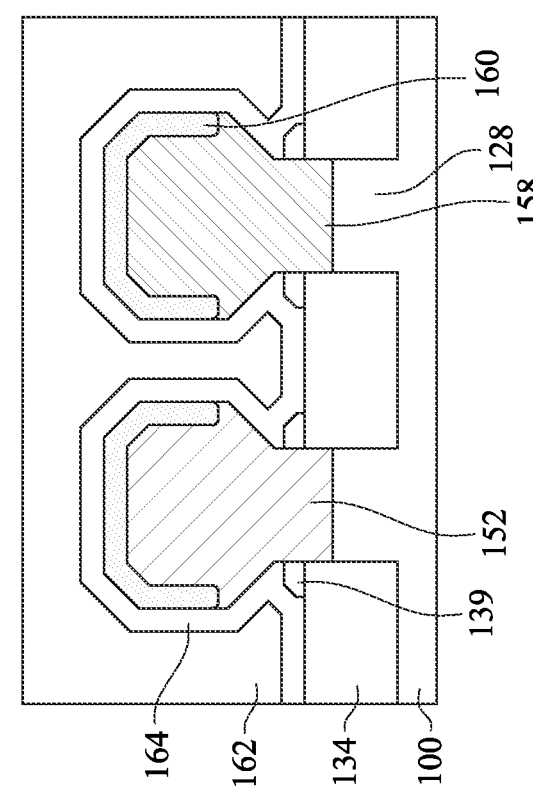
Fig. 18B
Fig. 18A

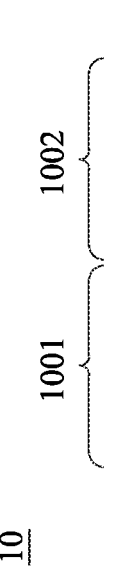
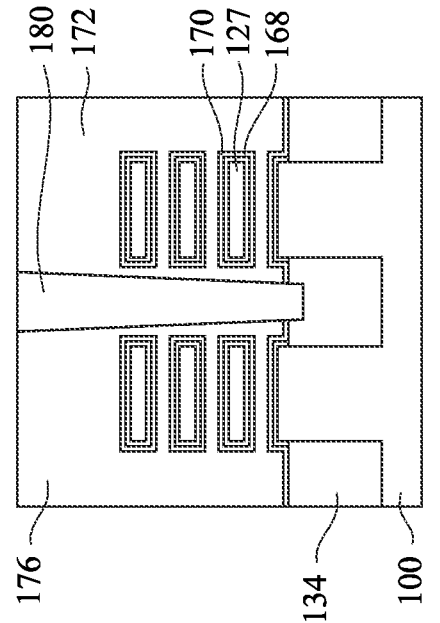
Fig. 19B
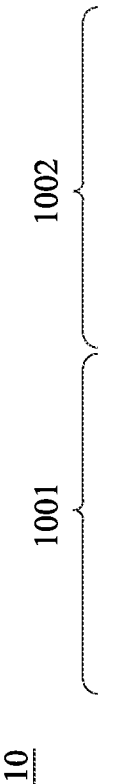
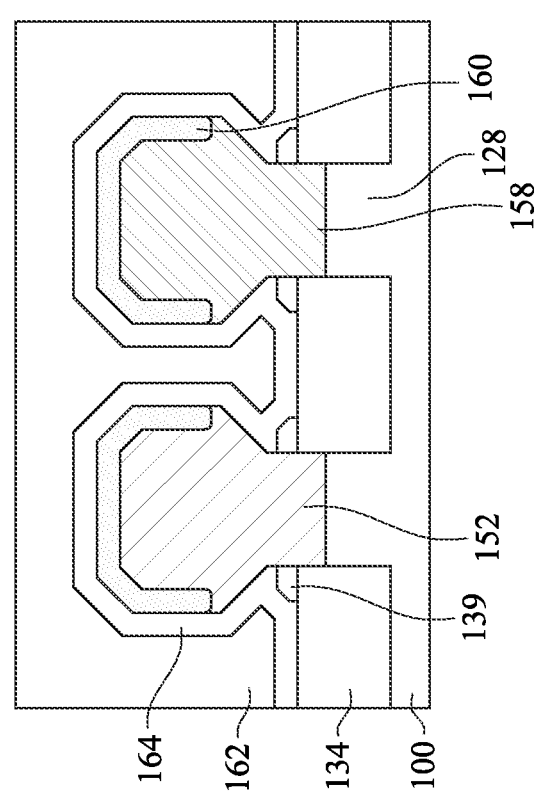
Fig. 19A

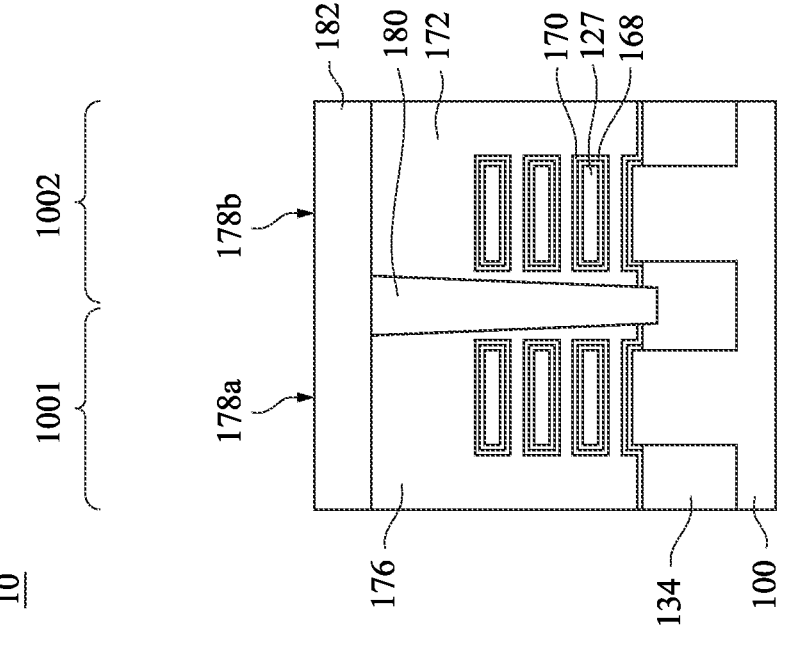
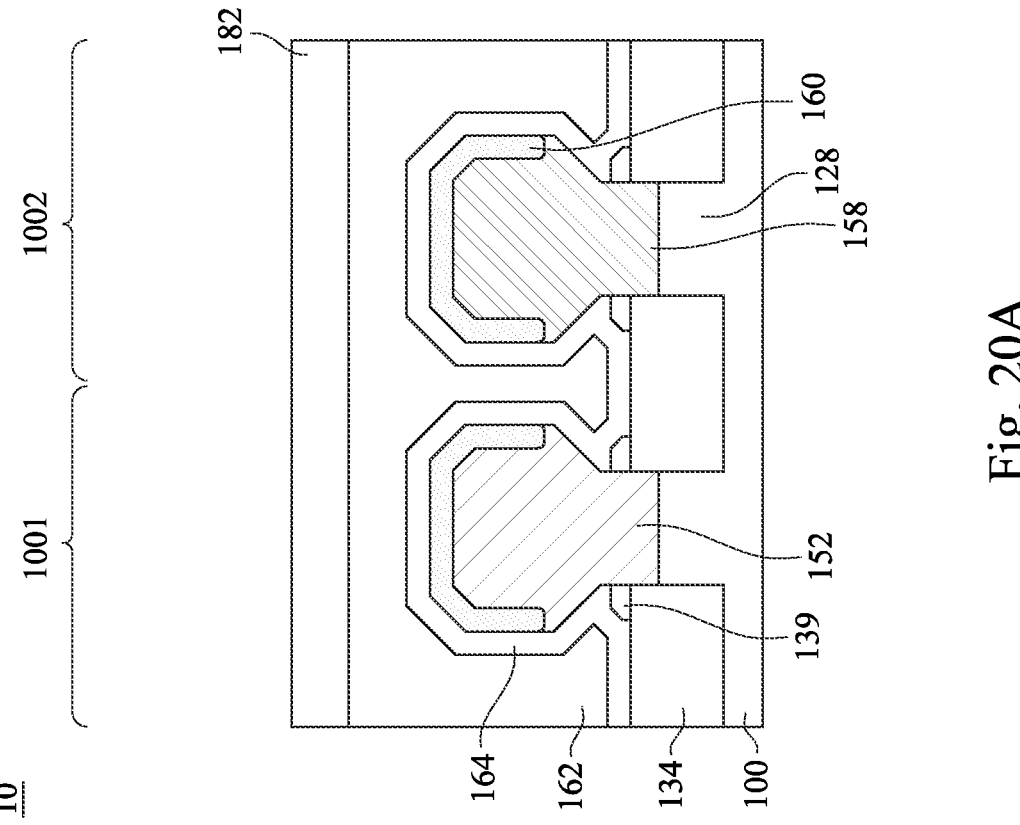

10

10

10a

10c

10c

METHOD OF FORMING SEMICONDUCTOR DEVICE WITH SILICIDE LAYER WITH DIFFERENT SILICIDE PHASES OR DIFFERENT THICKNESSES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 7A, 8A, 9A, 10A, 11A, 12A, 13A, 14A, 15A, 15D, 16A, 17A, 18A, 19A, 20A, 21A, 22A, 23A, 24A, 25, 26, 27A, 28A, 28C, 29A, 30A, 31A, 32A, 33A, and 34A are cross-sectional views along cross-section C-C' in FIG. 1.

FIGS. 6B, 11B, 12B, 13B, 14B, 17B, 18B, 19B, 20B, 21B, 22B, 23B, 27B, 28B, 29B, 31B, and 33B are cross-sectional views along cross-section A-A' in FIG. 1.

FIGS. 6C, 7B, 8B, 9B, 10B, 12C, 15B, 16B, 17C, 19C, 23C, 24B, 30B, 32B, and 34B are cross-sectional views along cross-section B-B' in FIG. 1.

FIGS. 14C, 15C, 16C, 17D, 19D, 23D, 24C, 30C, 32C, and 34C are cross-sectional views along cross-section D-D' in FIG. 1.

DETAILED DESCRIPTION

Figure 1:
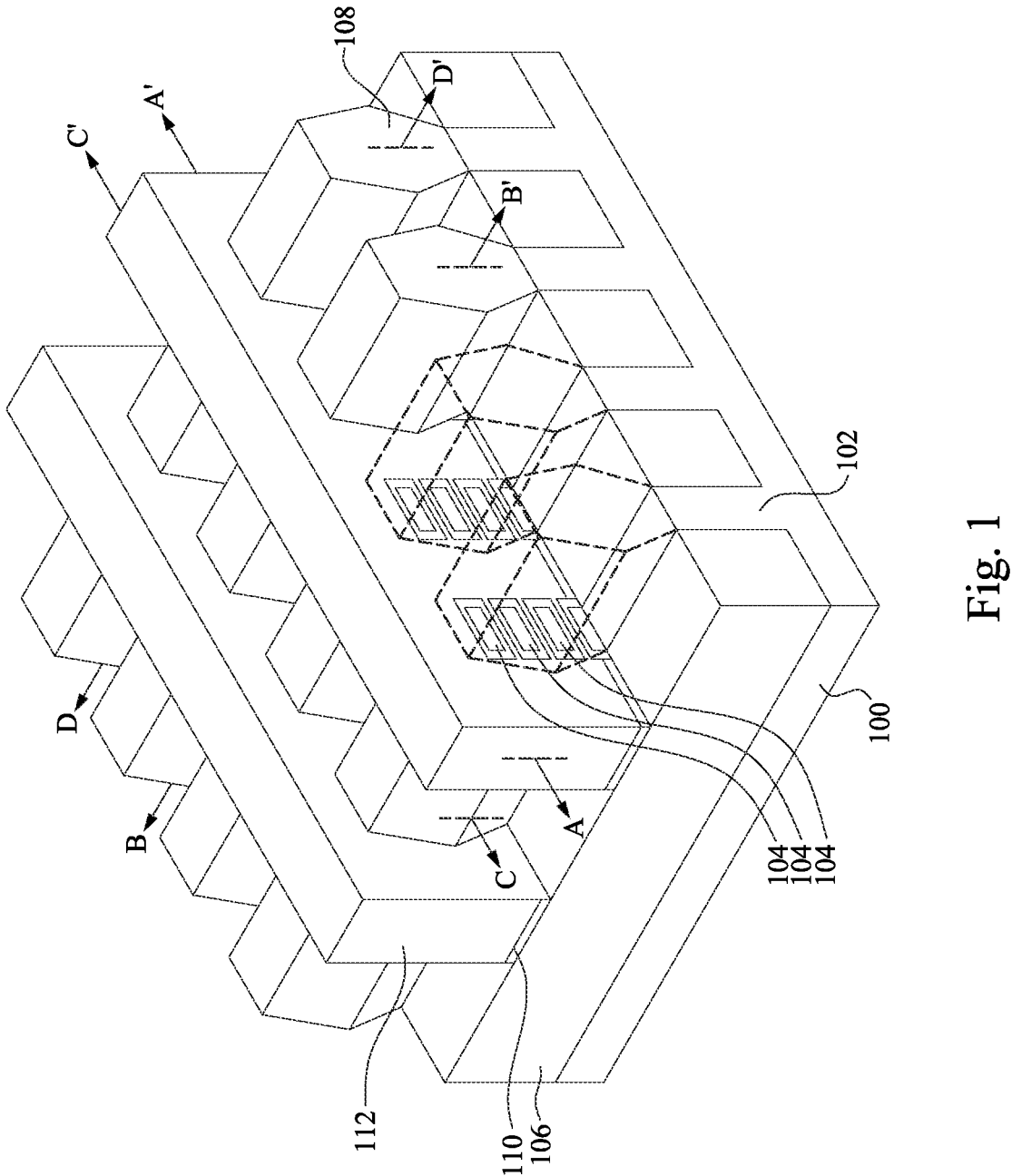
FIG. 1 illustrates an example of a nanosheet field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

To reduce contact resistances between metal gates and interconnect lines and between epitaxial source/drain features and the interconnect lines, metal silicide atop the metal gate and the epitaxial source/drain features are formed prior to forming the interconnect lines. However, due to scaling down of semiconductor devices, interconnect lines over epitaxial source/drain features have a reduced contact area, which increases a contact resistance to the epitaxial source/drain features.

The present disclosure provides a nanosheet field-effect transistor (NSFET) device having a silicide layer having a portion with a reduced thickness under a source/drain contact. This configuration offers reduction of a contact resistance of the silicide layer. In some embodiments where the silicide layer is a titanium silicide layer, the portion may have a $Ti_5Si_4$ phase to further reduce the contact resistance thereof. The various aspects of the present disclosure will be discussed below in greater detail with reference to FIGS. 1-35.

FIG. 1 illustrates an example of a nanosheet field-effect transistor (NSFET) device in a three-dimensional view, in accordance with some embodiments. The NSFET device comprises semiconductor fins 102 (also referred to as fins) protruding above a substrate 100. A gate electrode (e.g., a metal gate) 112 is disposed over the fins 102, and source/drain regions 108 are formed on opposing sides of the gate electrode 112. A plurality of nanosheets 104 are formed over the fins 102 and between source/drain regions 108. Isolation regions 106 are formed on opposing sides of the fins 102. A gate dielectric layer 110 is formed around the nanosheets 104. Gate electrodes 112 are over and around the gate dielectric layer 110.

FIG. 1 further illustrates reference cross-sections that are used in later figures. Cross-section A-A' is along a longitudinal axis of a gate electrode and in a direction, for example, perpendicular to the direction of current flow between the source/drain regions of an NSFET device. Cross-sections B-B' and D-D' are perpendicular to cross-section A-A' and are along a longitudinal axis of a fin and in a direction of, for example, a current flow between the source/drain regions of the NSFET device. Cross-section C-C' is parallel to cross-section A-A' and extends through epitaxial source/drain regions of the NSFET device. Subsequent figures refer to these reference cross-sections for clarity.

Figure 2:
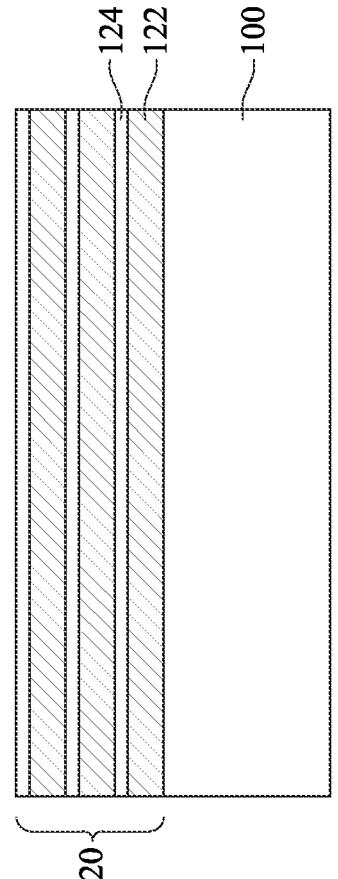

FIG. 2 is a cross-sectional view of the NSFET device 10 at subsequent stages of manufacturing, in accordance with an embodiment. In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 100 has a first device region 1001 and a second device region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be High Voltage (HV) devices (e.g., I/O devices), and second transistors in the second device region 1002 may be Low Voltage (LV) devices (e.g., logic devices). In some other embodiments, the first transistors are different from the second transistors at least in conductivity type. For example, the first device region 1001 can be for forming n-type devices, such as n-channel metal-oxide-semiconductor (NMOS) transistors, e.g., n-type GAA-FETs, and the second device region 1002 can be for forming p-type devices, such as p-channel metal-oxide-semiconductor (PMOS) transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

A multi-layer stack 120 is formed on the substrate 100. The multi-layer stack 120 includes alternating layers of a first semiconductor material 122 and a second semiconductor material 124. In FIG. 2, layers formed by the first semiconductor material 122 are labeled as 122, and layers formed by the second semiconductor material 124 are labeled as 124. The number of layers formed by the first and second semiconductor materials 122 and 124 illustrated in FIG. 2 are merely non-limiting examples. Other numbers of layers are also possible and are fully intended to be included within the scope of the present disclosure.

In some embodiments, the first semiconductor material 122 is an epitaxial material suitable for forming channel regions of, e.g., p-type FETs, such as silicon germanium ($Si_xGe_{1-x}$, where x can be in the range of 0 to 1). The second semiconductor material 124 is a silicon material being an epitaxial material suitable for forming channel regions of, e.g., n-type FETs. The multi-layer stacks 120 (may also be referred to as an epitaxial material stack) will be patterned to form channel regions of an NSFET in subsequent processing. In particular, the multi-layer stacks 120 will be patterned to form horizontal nanosheets, with the channel regions of the resulting NSFET including multiple horizontal nanosheets.

The multi-layer stack 120 may be formed by an epitaxial growth process, which may be performed in a growth chamber. During the epitaxial growth process, the growth chamber is cyclically exposed to a first set of precursors for selectively growing the first semiconductor material 122, and then exposed to a second set of precursors for selectively growing the second semiconductor material 124, in some embodiments. The first set of precursors includes precursors for the first semiconductor material (e.g., silicon germanium), and the second set of precursors includes precursors for the second semiconductor material. In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 122; and (2) disabling the flow of the germanium precursor to the growth chamber when growing the second semiconductor material 124. The cyclical exposure may be repeated until a target quantity of layers is formed.

FIGS. 3-23D and 24A-34C are cross-sectional views of the NSFET device 10 at subsequent stages of manufacturing, in accordance with an embodiment. FIGS. 6B. 11B, 12B, 13B, 14B, 17B, 18B, 19B, 20B, 21B, 22B, 23B, 27B, 28B, 29B, 31B, and 33B are cross-sectional views along cross-section A-A' in FIG. 1. FIGS. 6C, 7B, 8B, 9B, 10B, 12C, 15B. 16B. 17C, 19C, 23C, 24B, 30B, 32B, and 34B are cross-sectional views along cross-section B-B' in FIG. 1. FIGS. 2, 3, 4, 5, 6A, 7A, 8A, 9A, 10A, 11A, 12A, 13A, 14A, 15A, 15D, 16A, 17A, 18A, 19A, 20A, 21A, 22A, 23A, 24A, 25, 26, 27A, 28A, 28C, 29A, 30A, 31A, 32A, 33A, and 34A are cross-sectional views along cross-section C-C' in FIG. 1. FIGS. 14C, 15C, 16C, 17D, 19D, 23D, 24C, 30C. 32C, and 34C are cross-sectional views along cross-section D-D' in FIG. 1. Although two fins and two gate structures are illustrated in the figures as a non-limiting example, it should be appreciated that other numbers of fins and other numbers of gate structures may also be formed.

Figure 3:
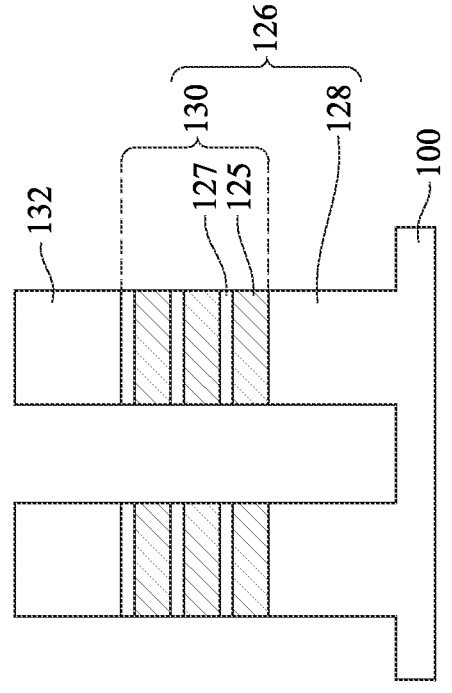

In FIG. 3, fin structures 126 are formed protruding above the substrate 100. The fin structures 126 each include a semiconductor fin 128 and a nanostructure 130 overlying the semiconductor fin 128. The nanostructure 130 and the semiconductor fin 128 may be formed by etching trenches in the multi-layer stack 120 and the substrate 100, respectively. The etching may be anisotropic. Forming the nanostructures 130 by etching the multi-layer stack 120 may further define first nanostructures 125 from the first semiconductor layers 122 and define second nanostructures 127 from the second semiconductor layers 124. The first nanostructures 125 and the second nanostructures 127 may further be collectively referred to as nanostructures 130.

The fin structures 126 may be patterned by any suitable method. For example, the fin structure 126 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 126.

In some embodiments, the remaining spacers are used to pattern a mask 132, which is then used to pattern the fin structure 126. The mask 132 may be a single layer mask, or may be a multilayer mask such as a multilayer mask that includes a first mask layer and a second mask layer. The first mask layer and second mask layer may each be formed from a dielectric material such as silicon oxide, silicon nitride, a combination thereof, or the like, and may be deposited or thermally grown according to suitable techniques. The first mask layer and second mask layer are different materials having a high etching selectivity. For example, the first mask layer may be silicon oxide, and the second mask layer may be silicon nitride. The mask 132 may be formed by patterning the first mask layer and the second mask layer using any acceptable etching process. The mask 132 may then be used as an etching mask to etch the substrate 100 and the multi-layer stack 120 The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 120 form the nanostructure 130, and the patterned substrate 100 form the semiconductor fin 128, as illustrated in FIG. 3. Therefore, in the illustrated embodiment, the nanostructure 130 also includes alternating layers of the first semiconductor material 122 and the second semiconductor material 124, and the semiconductor fin 128 is formed of a same material (e.g., silicon) as the substrate 100.

Figure 4:
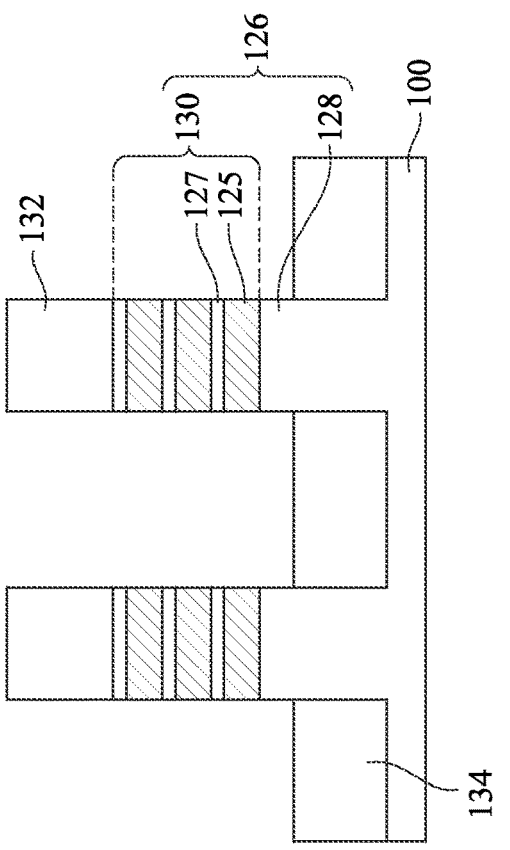

Next, in FIG. 4, Shallow Trench Isolation (STI) regions 134 are formed over the substrate 100 and on opposing sides of the fin structure 126. As an example to form the STI regions 134, an insulation material may be formed over the substrate 100. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 126. In some embodiments, a liner is first formed along surfaces of the substrate 100 and fin structure 126, and a fill material, such as those discussed above is formed over the liner. In some embodiments, the liner is omitted.

Next, a removal process is applied to the insulation material to remove excess insulation material over the fin structure 126. In some embodiments, a planarization process such as a chemical mechanical polish (CMP), an etch back process, combinations thereof, or the like may be utilized. The planarization process exposes the nanostructure 130 such that top surfaces of the nanostructure 130 and the insulation material are level after the planarization process is complete. Next, the insulation material is recessed to form the STI regions 134. The insulation material is recessed such that the nanostructure 130 protrudes from between neighboring STI regions 134. Top portions of the semiconductor fin 128 may also protrude from between neighboring STI regions 134. Further, the top surfaces of the STI regions 134 may have a flat surface as illustrated, a convex surface, a concave surface (such as dishing), or a combination thereof. The top surfaces of the STI regions 134 may be formed flat, convex, and/or concave by an appropriate etch. The STI regions 134 may be recessed using an acceptable etchin33g process, such as one that is selective to the material of the insulation material (e.g., etches the material of the insulation material at a faster rate than the material of the semiconductor fins 128 and the nanostructures 130). For example, a chemical oxide removal with a suitable etchant such as dilute hydrofluoric (dHF) acid may be used.

Figure 5:
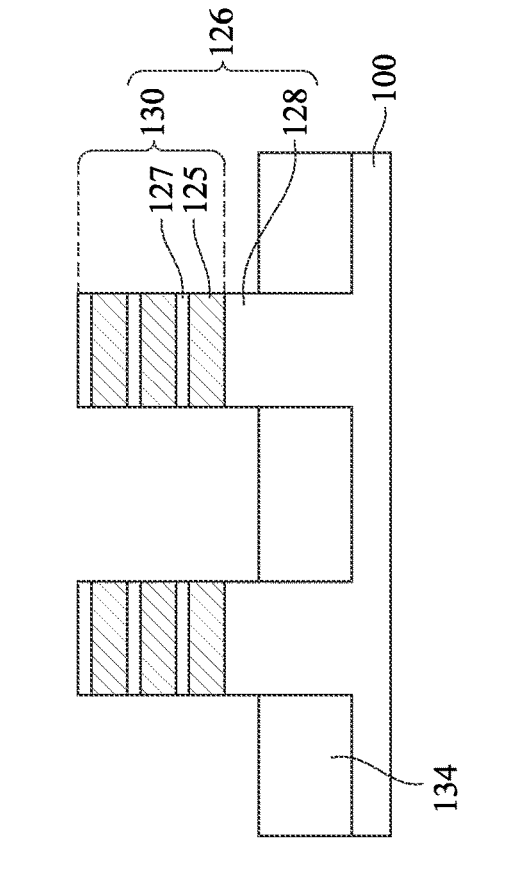
Figure 6B:
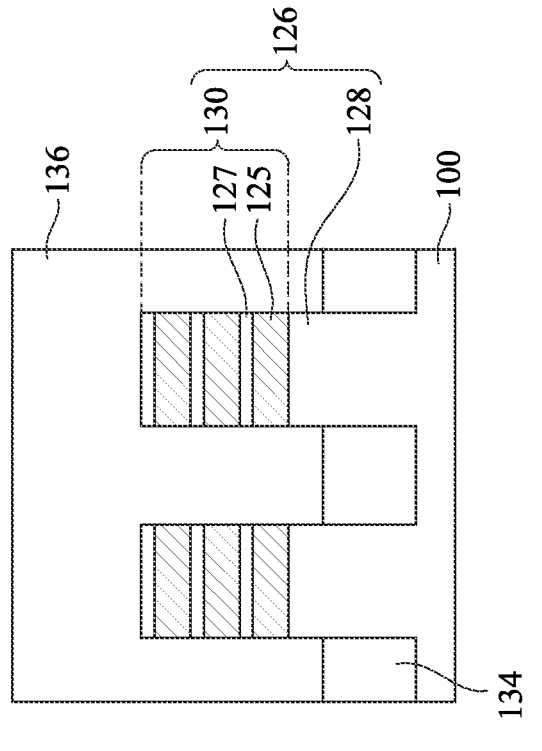
Figure 6A:
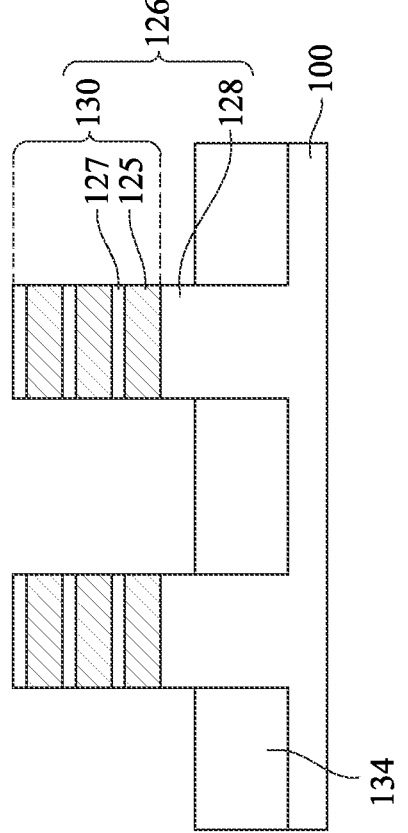
Figure 6C:
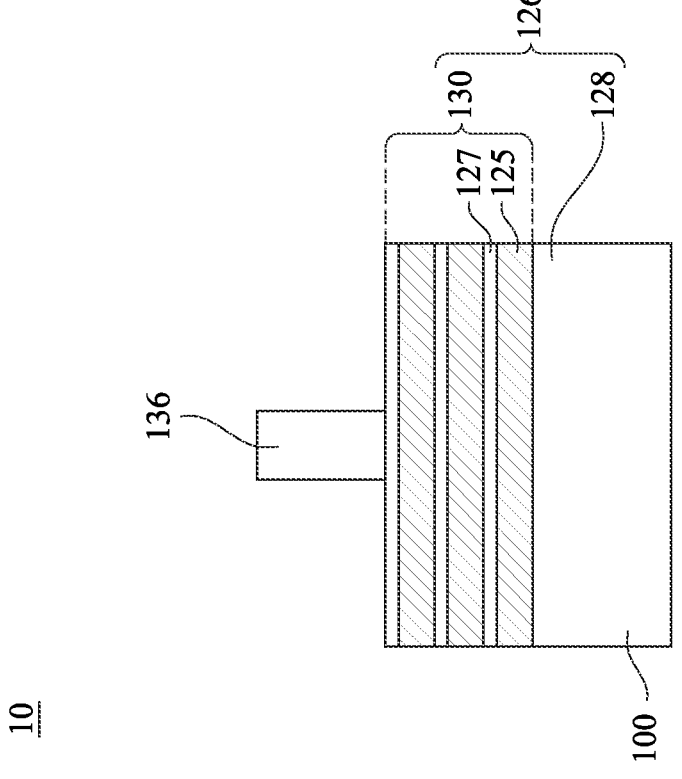

Referring to FIG. 5, the mask 132 is then removed by using a dry etch or a wet etch, exposing the nanostructure 130. Referring to FIGS. 6A, 6B and 6C, a dummy gate stack 136 is formed over the nanostructure 130 and over the STI region 134. The formation of the dummy gate stack may include forming a dummy gate dielectric over the nanostructure 130 and over the STI region 134 and then forming a dummy gate over the dummy gate dielectric. The dummy gate dielectric may be, for example, silicon oxide, silicon nitride, a combination thereof, or the like, and may be deposited or thermally grown according to acceptable techniques. In an embodiment, a layer of silicon is conformally formed over the nanostructure 130 and over the upper surface of the STI regions 134, and a thermal oxidization process is performed to convert the deposited silicon layer into an oxide layer as the dummy gate dielectric.

To form the dummy gate, a dummy gate layer may be formed over the dummy gate dielectric. The dummy gate layer may be deposited over the dummy gate dielectric and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 134. The dummy gate covers respective channel regions of the nanostructures 130. The dummy gate may also have a lengthwise direction substantially perpendicular to the lengthwise direction of the semiconductor fins 128. The dummy gate and the dummy gate dielectric are collectively referred to as dummy gate structure, in some embodiments.

Figure 7A:
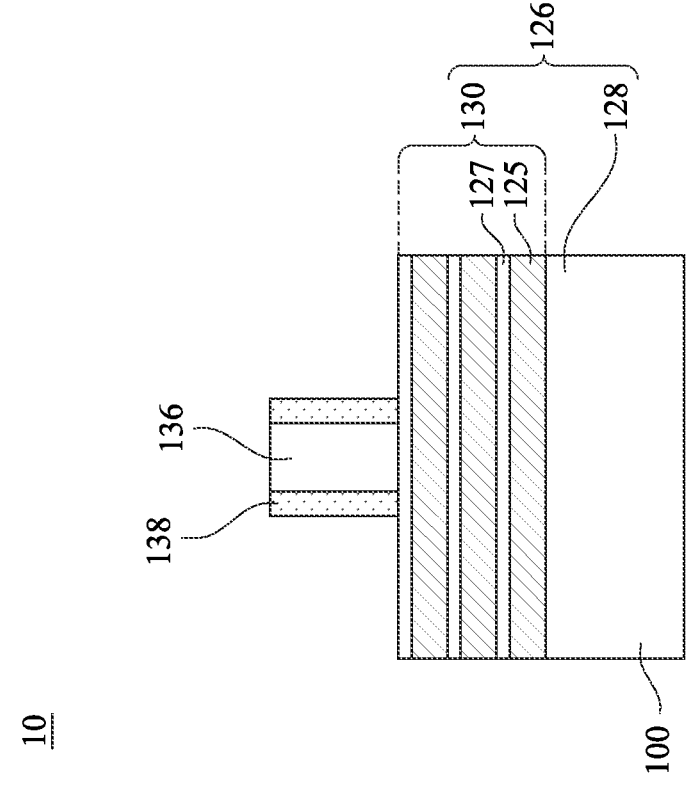
Figure 7B:
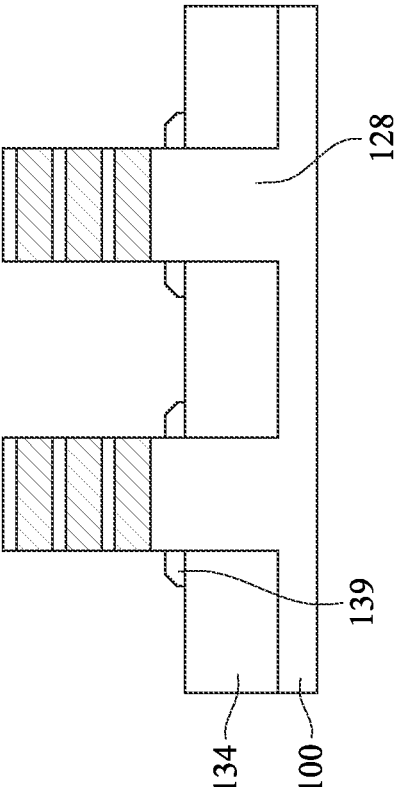

In FIGS. 7A and 7B, gate spacers 138 are formed adjacent to the dummy gate stack 136. Fin spacers 139 are formed on tops of the STI regions 134. For example, the gate spacers 138 are disposed adjacent to (for example, along sidewalls of) the dummy gate stack 136. The gate spacers 138 and the fin spacers 139 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over the fin structures 126 and the STI regions 134 and subsequently anisotropically etched to form the gate spacers 138 and the fin spacers 139. In some implementations, the fin spacers 139 and the gate spacers 138 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to the dummy gate stack. In such implementations, the various sets of spacers can include materials having different etch rates. For example, a first dielectric layer including silicon and oxygen (for example, silicon oxide) can be deposited over the fins structures 126 and the STI regions 134 and subsequently anisotropically etched to form a first spacer set adjacent to the dummy gate stack and on the STI regions 134, and a second dielectric layer including silicon and nitrogen (for example, silicon nitride) can be deposited over the fin structures 126 and the STI regions 134 and subsequently anisotropically etched to form a second spacer set adjacent to the first spacer set.

After the formation of the gate spacers 138, implantation for lightly doped source/drain (LDD) regions (not shown) may be performed. Appropriate type (e.g., p-type or n-type) impurities may be implanted into the exposed nanostructure 130 and/or the semiconductor fin 128. The n-type impurities may be the any suitable n-type impurities, such as phosphorus, arsenic, antimony, or the like, and the p-type impurities may be the any suitable p-type impurities, such as boron, $BF_2$, indium, or the like. An anneal process may be used to activate the implanted impurities.

Figure 8B:
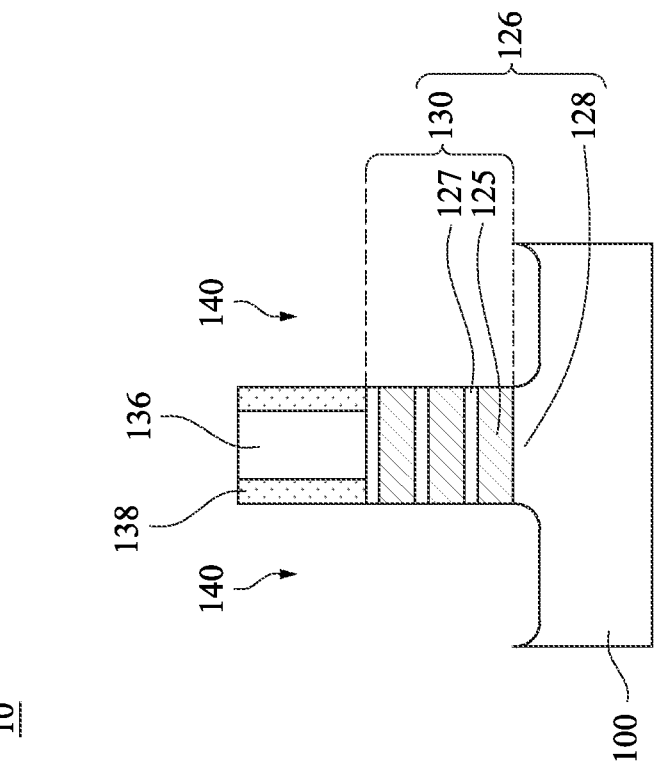
Figure 8A:
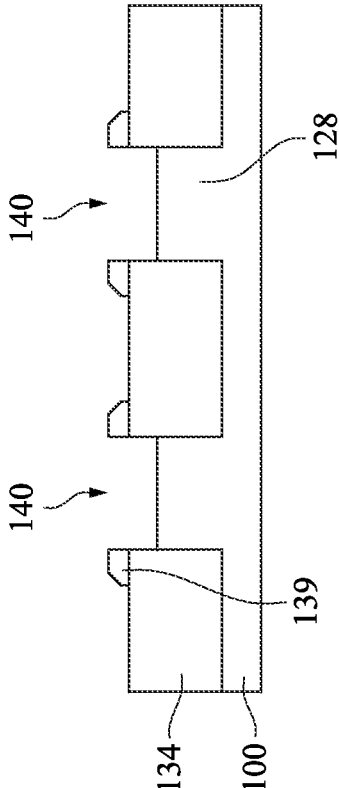

In FIGS. 8A and 8B, source/drain recesses 140 are formed in the fin structures 126 (i.e., the nanostructures 130, and the semiconductor fin 128), in accordance with some embodiments. Epitaxial source/drain regions will be subsequently formed in the source/drain recesses 140. The source/drain recesses 140 may extend through the first nanostructures 125 and the second nanostructures 127, and into the substrate 100. As illustrated in FIGS. 8A-8B, the fin structures 126 may be etched such that bottom surfaces of the source/drain recesses 140 are disposed below the top surfaces of the STI regions 134, as an example. In some other embodiments, the fin structures 126 may be etched such that the bottom surfaces of the source/drain recesses 140 may be level with top surfaces of the STI regions 134 or above the top surfaces of the STI regions 134. The source/drain recesses 140 may be formed by etching the fin structures 126, the nanostructures 130, and the substrate 100 using anisotropic etching processes, such as RIE, NBE, or the like. The gate spacers 138 mask portions of the fin structures 206, the nanostructures 130, and the substrate 100 during the etching processes used to form the source/drain recesses 140. A single etch process or multiple etch processes may be used to etch each layer of the nanostructures 130 and/or the semiconductor fin 128. Timed etch processes may be used to stop the etching of the source/drain recesses 140 after the source/drain recesses 140 reach a target depth.

Portions of sidewalls of the layers of the multi-layer stack 120 formed of the first semiconductor materials (e.g., the first nanostructures 125) exposed by the source/drain recesses 140 are etched to form sidewall recesses 142 between corresponding second nanostructures 127. Although sidewalls of the first nanostructures 125 in the sidewall recesses 142 are illustrated as being concave straight in FIG. 9B, the sidewalls may be straight or convex. The sidewalls may be etched using isotropic etching processes, such as wet etching or the like. In some embodiments in which the first nanostructures 125 include, e.g., SiGe, and the second nanostructures 127 include, e.g., Si or SiC, a dry etch process with tetramethylammonium hydroxide (TMAH), ammonium hydroxide ($NH_4OH$), or the like may be used to etch sidewalls of the first nanostructures 125.

Figures 9A, 9B:
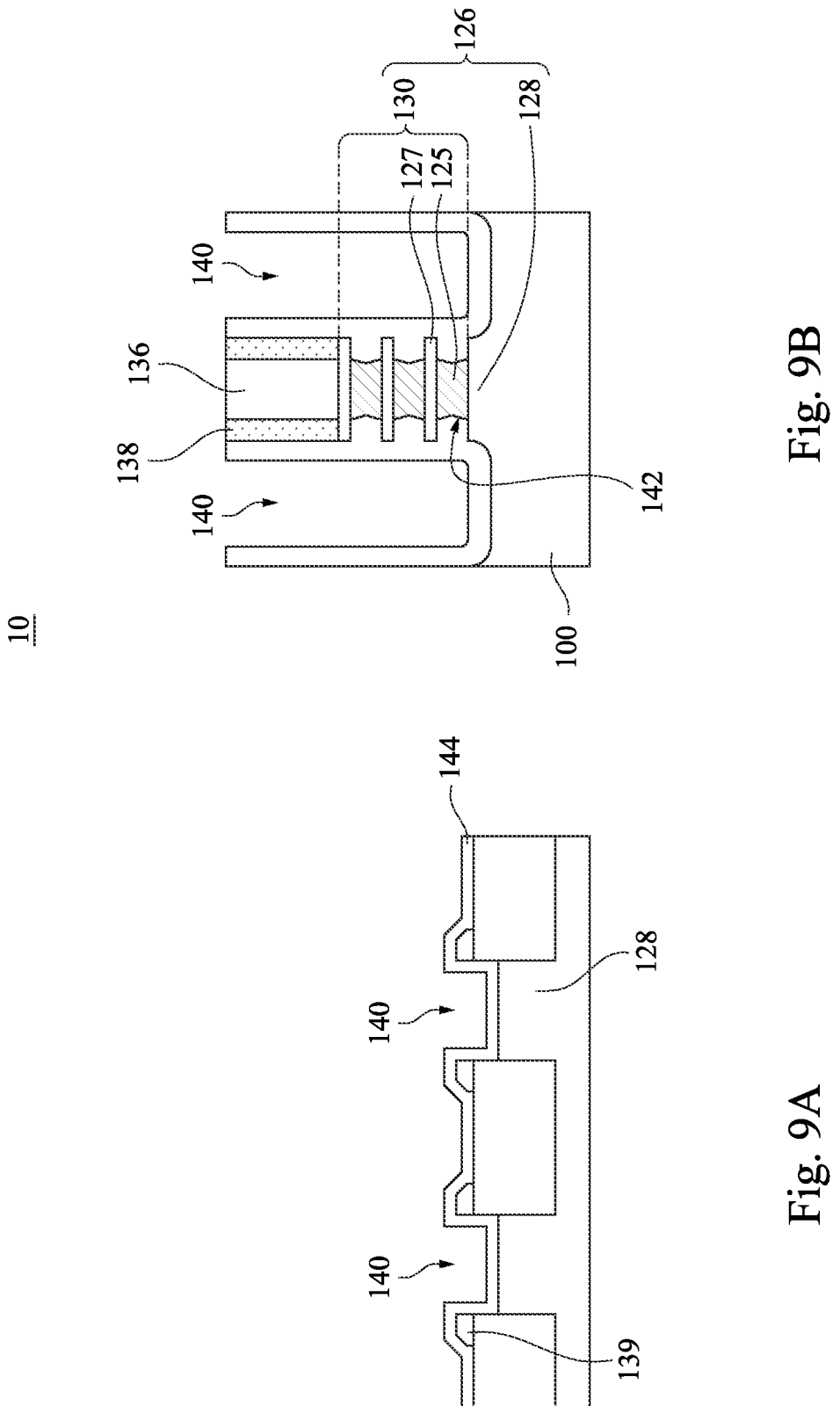
Figure 10B:
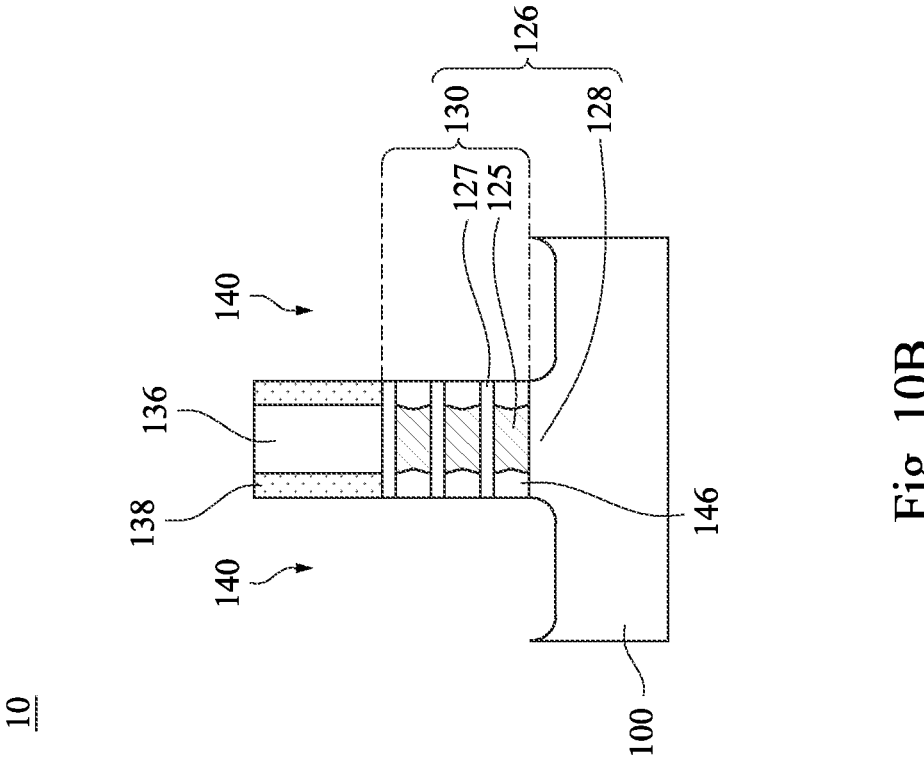
Figure 10A:
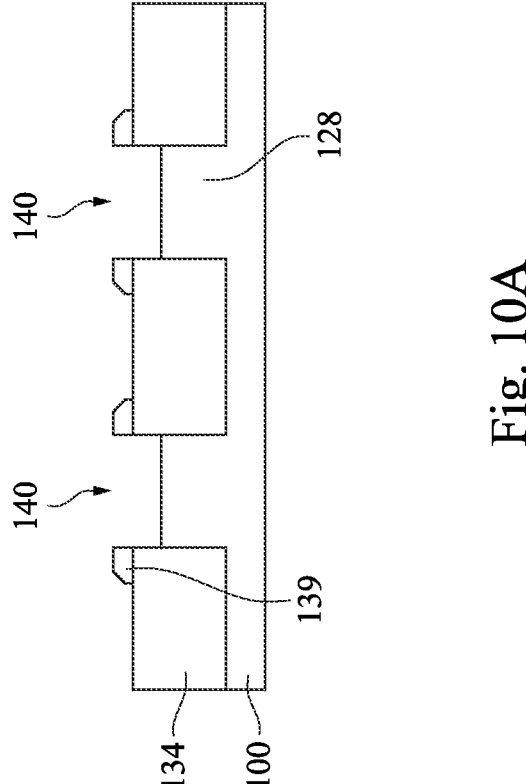

In FIGS. 9A and 9B, an inner spacer layer 144 is deposited over the fin structures 126, the STI region 134, the dummy gate stack 136 and the source/drain recesses 140. The inner spacer layer 144 is formed in the sidewall recess 142. The inner spacer layer 144 may be deposited by a conformal deposition process, such as CVD, ALD, or the like. The inner spacer layer 144 may comprise a material such as silicon nitride or silicon oxynitride, although any suitable material, such as low-dielectric constant (low-k) materials having a k-value less than about 3.5, may be utilized. The inner spacer layer 144 may then be anisotropically etched to form the inner spacers 146, as shown in FIGS. 10A and 10B. The inner spacer layer 144 may be etched by an anisotropic etching process, such as RIE, NBE, or the like. The inner spacers 146 may be used to prevent damage to subsequently formed source/drain regions (such as the epitaxial source/drain regions, discussed below with respect to FIGS. 12C and 14C) by subsequent etching processes, such as etching processes used to form gate structures.

The inner spacers 146 act as isolation features between subsequently formed epitaxial source/drain regions and gate structure. As will be discussed in greater detail below, epitaxial source/drain regions will be formed in the source/drain recesses 140, and the first nanostructures 125 will be replaced with corresponding gate structures.

Although outer sidewalls of the inner spacers 146 are illustrated as being flush with sidewalls of the second nanostructures 127, the outer sidewalls of the inner spacers 146 may extend beyond or be recessed from sidewalls of the second nanostructures 127.

Figures 11A, 11B:
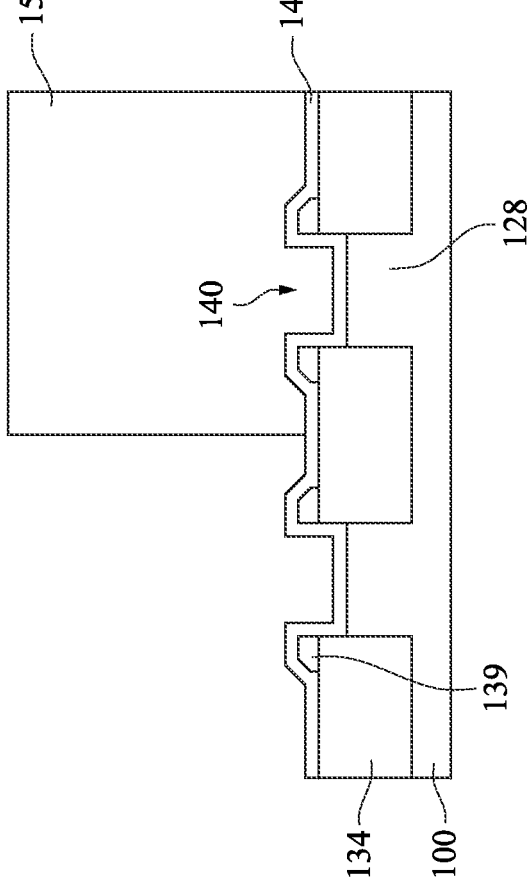

Moreover, although the outer sidewalls of the inner spacers 146 are illustrated as being straight in FIG. 10B, the outer sidewalls of the inner spacers 146 may be concave or convex. A hard mask layer 148 is deposited on the source/drain recesses 140, the STI regions 134 and the fin spacers 139. In FIGS. 11A and 11B, a photoresist layer 150 is then formed over the hard mask layer 148 and patterned to expose the first device region 1001 but not expose the second device region 1002. In some embodiments, the photoresist layer 150 is an organic material formed using a spin-on coating process, followed by patterning the organic material to expose the first device region 1001 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation.

After the patterned photoresist layer 150 is formed, the exposed portion of the hard mask layer 148 in the first device region 1001 is removed by using the patterned photoresist layer 150 as an etch mask, so that the fin structure 126 is exposed in the first device region 1001. In some embodiments, the hard mask layer 148 may be etched by using a plasma dry etching using fluorine-based and/or chlorine-based etchants.

For example, the hard mask layer 148 may be removed by a wet etching process using an etchant that is selective to the material of the hard mask layer 148. Stated differently, the etchant used in removing the hard mask layer 148 etches the material (e.g., aluminum oxide) of the hard mask layer 148 at a faster etch rate than etching the material of the semiconductor fin 128.

Next, the photoresist layer 150 is removed from the second device region 1002 by using, for example, a plasma ash process. In some embodiments, a plasma ash process is performed such that the temperature of the organic material of the photoresist is increased until these organic materials experience a thermal decomposition and may be removed by a wet etching process using an etchant that is selective to the material of the hard mask layer 148.

Figures 12A, 12B:
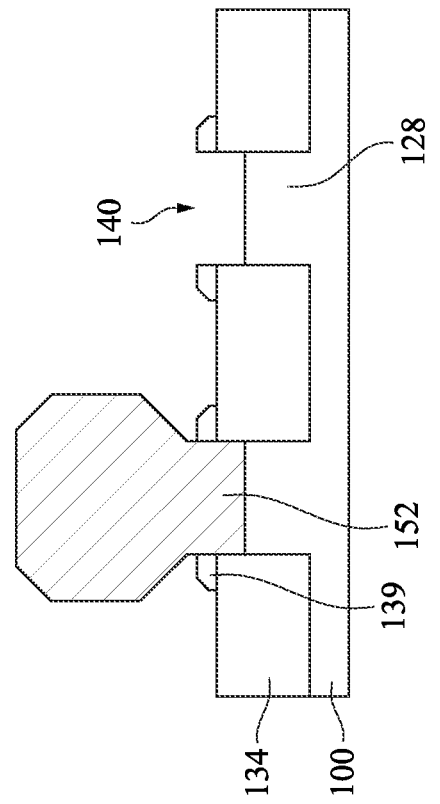
Figure 12C:
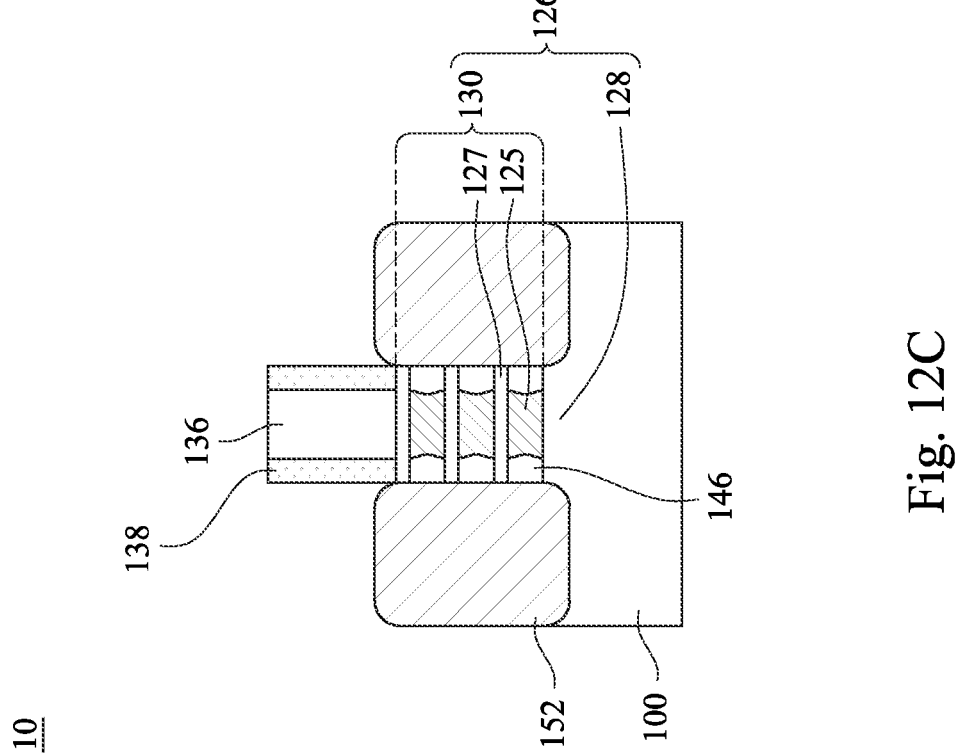

Epitaxial source/drain regions 152 are formed in the source/drain recesses 140. In some embodiments, the epitaxial source/drain regions 152 may exert stress on the second nanostructures 127, thereby improving device performance. As illustrated in FIGS. 12A-12C, the epitaxial source/drain regions 152 are formed in the source/drain recesses 140 such that each dummy gate stack 136 is disposed between respective neighboring pairs of the epitaxial source/drain regions 152. In some embodiments, the inner spacers 146 are used to separate the epitaxial source/drain regions 152 from the dummy gate stacks 136 and are used to separate the epitaxial source/drain regions 152 from the first nanostructures 125 by an appropriate lateral distance so that the epitaxial source/drain regions 152 do not short out with subsequently formed gates of the resulting NSFET device.

In some embodiments, the epitaxial source/drain regions 152 may include any acceptable material appropriate for n-type NSFET device. For example, if the second nanostructures 127 are silicon, the epitaxial source/drain regions 152 may include materials exerting a tensile strain on the second nanostructures 127, such as silicon carbide, phosphorous doped silicon carbide, silicon phosphide, or the like.

The epitaxial source/drain regions 152 may be implanted with dopants to form source/drain regions, followed by an anneal. The n-type and/or p-type impurities for source/drain regions may be any of the impurities previously discussed. In some embodiments, the epitaxial source/drain regions 152 may be in situ doped during growth. After the formation of the epitaxial source/drain regions 152, the hard mask layer 148 is removed from the second device region 1002 by a wet etching process using an etchant that is selective to the material of the hard mask layer 148. Stated differently, the etchant used in removing the hard mask layer 148 etches the material of the hard mask layer 148 at a faster etch rate than etching the material of the epitaxial source/drain regions 152.

Figures 13A, 13B:
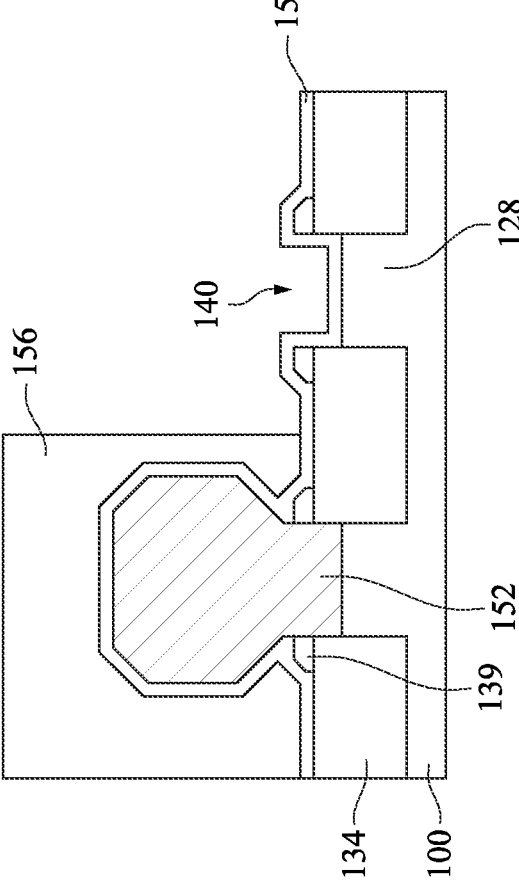

In FIGS. 13A and 13B, a hard mask layer 154 is deposited on the source/drain recesses 140 in the second device region 1002, the STI regions 134 and the epitaxial source/drain regions 152 in the first device region 1001. A photoresist layer 156 is then formed over the hard mask layer 154 and patterned to expose the second device region 1002 but not expose the first device region 1001. In some embodiments, the photoresist layer 156 is an organic material formed using a spin-on coating process, followed by patterning the organic material to expose the first device region 1001 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation.

After the patterned photoresist layer 156 is formed, the exposed portion of the hard mask layer 154 in the second device region 1002 is removed by using the patterned photoresist layer 156 as an etch mask, so that the semiconductor fin 128 is exposed in the second device region 1002. In some embodiments, the hard mask layer 154 may be etched by using a plasma dry etching using fluorine-based and/or chlorine-based etchants. For example, the hard mask layer 154 may be removed by a wet etching process using an etchant that is selective to the material of the hard mask layer 154. Stated differently, the etchant used in removing the hard mask layer 154 etches the material of the hard mask layer 154 at a faster etch rate than etching the material of the semiconductor fin 128.

Next, the photoresist layer 156 is removed from the second device region 1002 by using, for example, a plasma ash process. In some embodiments, a plasma ash process is performed such that the temperature of the organic material of the photoresist is increased until these organic materials experience a thermal decomposition and may be removed by a wet etching process using an etchant that is selective to the material of the hard mask layer 154.

Figure 14B:
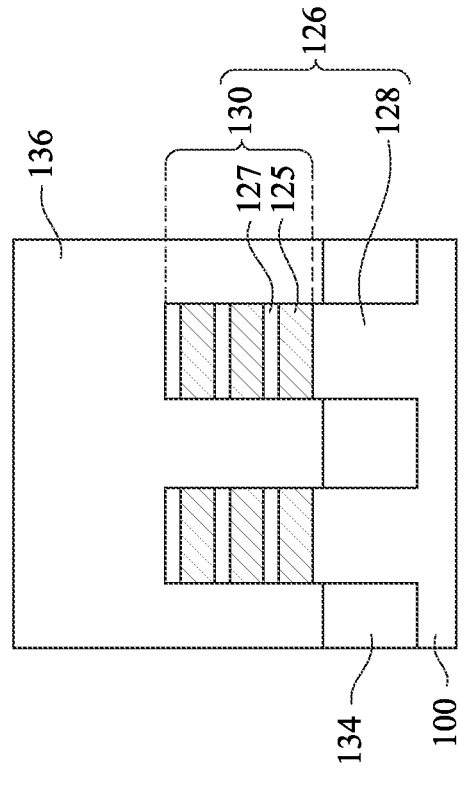
Figure 14A:
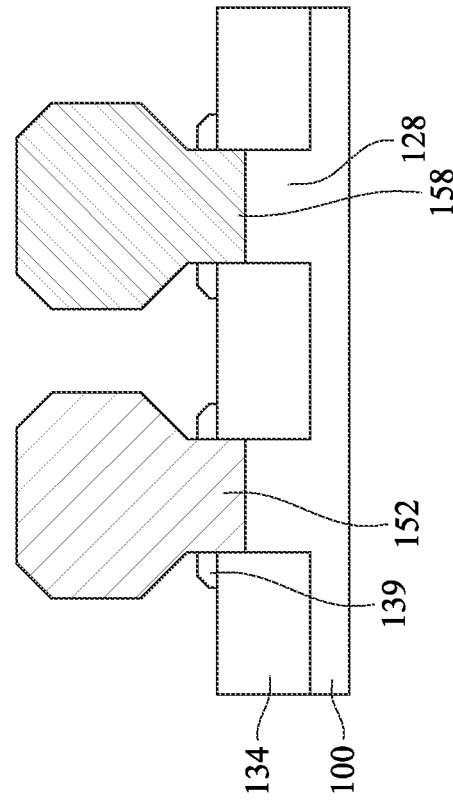
Figure 14C:
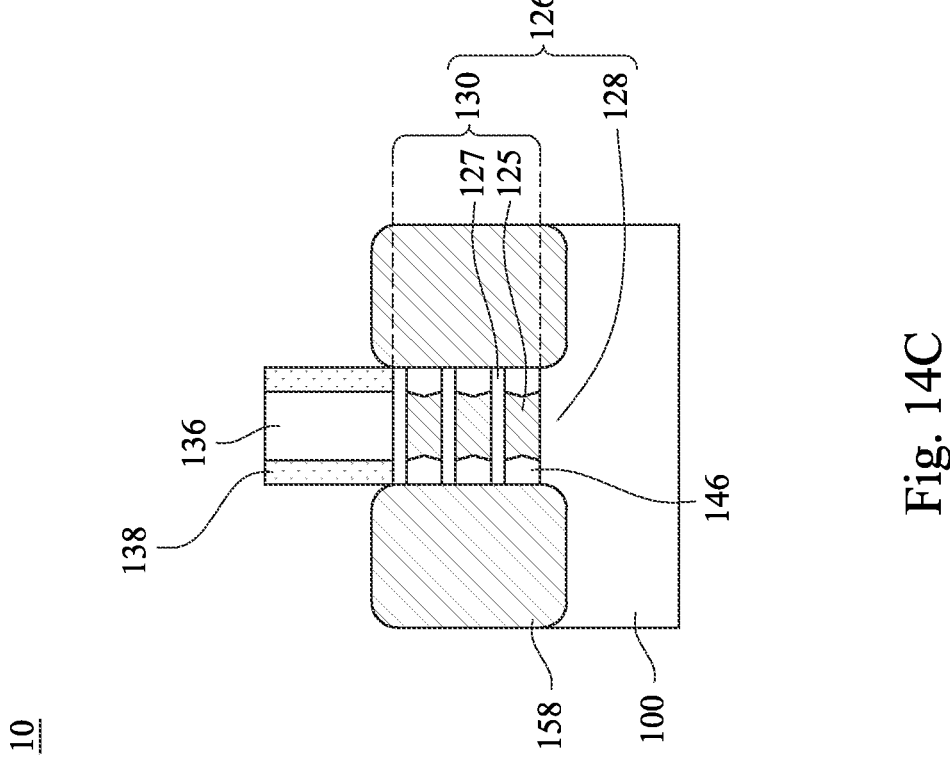

In FIGS. 14A-14C, epitaxial source/drain regions 158 are formed in the source/drain recesses 140. In some embodiments, the epitaxial source/drain regions 158 may exert stress on the second nanostructures 127, thereby improving device performance. As illustrated in FIG. 14C, the epitaxial source/drain regions 158 are formed in the source/drain recesses 140 such that each dummy gate stack 136 is disposed between respective neighboring pairs of the epitaxial source/drain regions 158. In some embodiments, the inner spacers 146 are used to separate the epitaxial source/drain regions 158 from the dummy gate stack 136 and are used to separate the epitaxial source/drain regions 158 from the first nanostructures 125 by an appropriate lateral distance so that the epitaxial source/drain regions 158 do not short out with subsequently formed gates of the resulting NSFET device.

In some embodiments, the epitaxial source/drain regions 158 may include any acceptable material appropriate for p-type NSFET devices. For example, if the second nanostructures 127 are silicon, the epitaxial source/drain regions 158 may comprise materials exerting a compressive strain on the second nanostructures 127, such as silicon germanium, boron doped silicon germanium, germanium, germanium tin, or the like. The epitaxial source/drain regions 158 may have surfaces raised from respective upper surfaces of the nanostructures 130 and may have facets.

After the formation of the epitaxial source/drain regions 158, the hard mask layer 154 is removed from the first device region 1001 by a wet etching process using an etchant that is selective to the material of the hard mask layer 154. Stated differently, the etchant used in removing the hard mask layer 154 etches the material of the hard mask layer 154 at a faster etch rate than etching the material of the epitaxial source/drain regions 158.

Figure 15A:
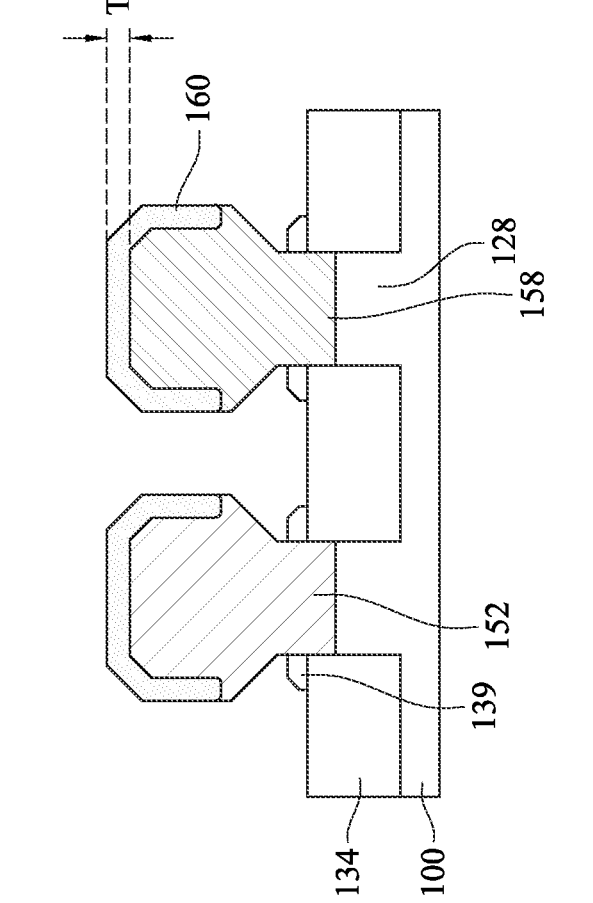
Figure 15C:
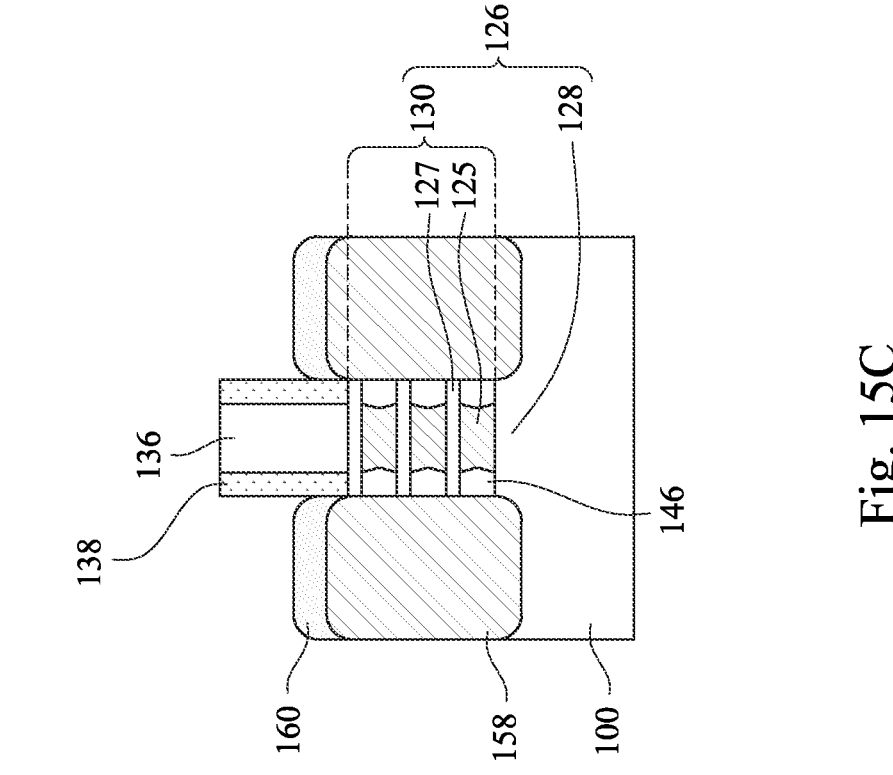
Figure 15B:
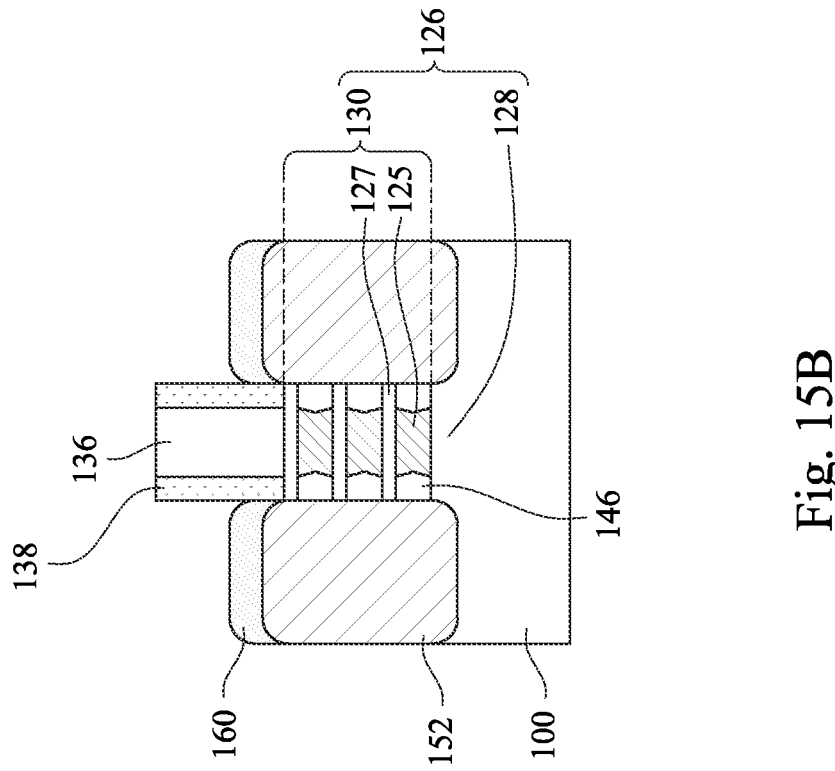

In FIGS. 15A, 15B and 15C, a first silicide layer 160 is formed on the epitaxial source/drain regions 152, 158 to reduce the contact resistance between the epitaxial source/drain regions 152, 158 and subsequently formed source/drain contacts. Since the first silicide layer 160 is formed before forming a metal gate stack, it is referred to as a silicide-first scheme. The first silicide layer 160 may include materials such as $TiSi_x$, $NiSi_x$, $CoSi_x$, $MoSi_x$, $PtSi_x$, $TiSi_xGe_y$, $NiSi_xGe_y$, $CoSi_xGe_y$, $MoSi_xGe_y$, $PtSi_xGe_y$, the like, or a combination thereof.

Figure 15D:
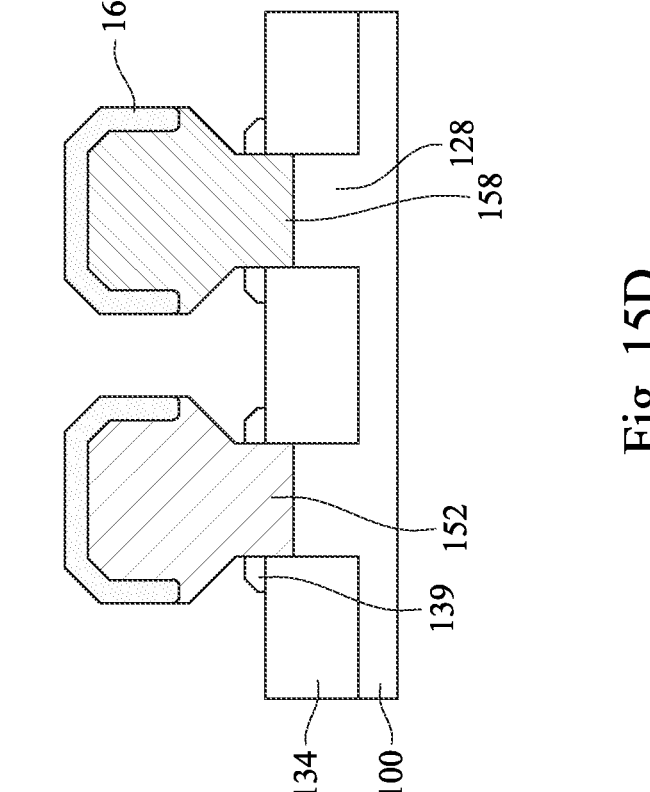

The first silicide layer 160 may be formed by silicidation such as self-aligned silicide process (Salicide), in which a metal is deposited, reacted with the epitaxial source/drain regions 152, 158 during an annealing process, and then the unreacted metal is removed by etch. For example, after the deposition of the metal, a temperature is raised during the annealing process to enhance a reaction between the epitaxial source/drain regions 152, 158 and the metal to form the first silicide layer 160. In some embodiments, the deposition of the metal may include a sputtering deposition. The first silicide layer 160 covers a top and an upper sidewall of the epitaxial source/drain regions 152, 158 without covering a bottom sidewall of the epitaxial source/drain regions 232. In some other embodiments, as shown in FIG. 15D, the first silicide layer 160 wraps around the epitaxial source/drain regions 152, 158.

Referring back to FIG. 15A, in some embodiments where the first silicide layer 160 includes $TiSi_x$, the first silicide layer 160 may have a C49-TiSi$_2$ phase or a C54-TiSi$_2$ phase, which has low sheet resistance (Rs), for example, in a range from 10 μOhm-cm to 70 μOhm-cm. In some embodiments, the first silicide layer 160 has a thickness T1 in a range from 4 nm to 12 nm. In some embodiment, the first silicide layers 160 in the first device region 1001 and in the second device region 1002 have the same material and the same silicide phase. In some other embodiments, the first silicide layers 160 in the first device region 1001 and the second device region 1002 may have different materials or different silicide phases.

Figure 16A:
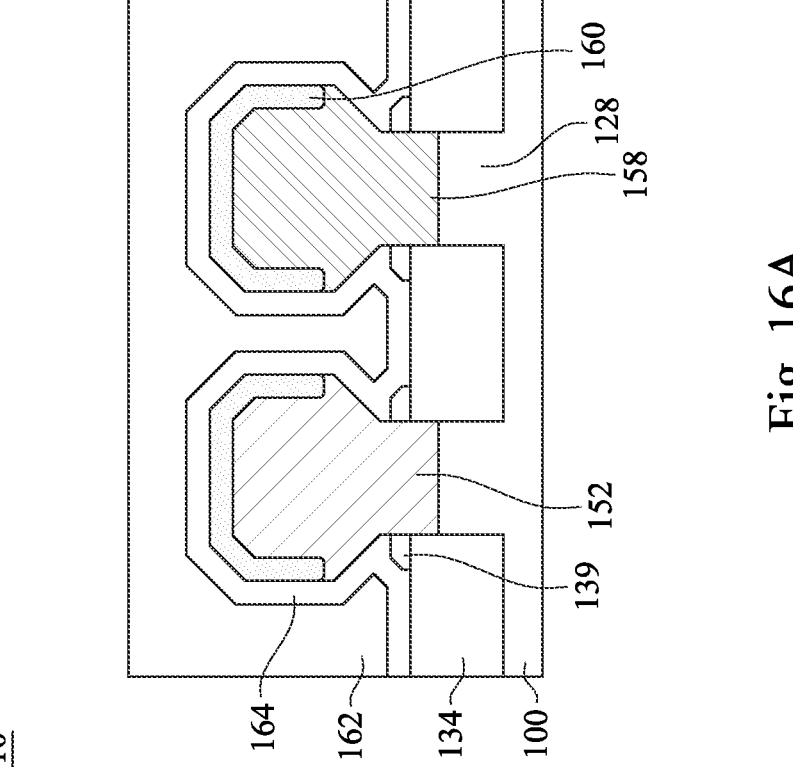
Figure 16C:
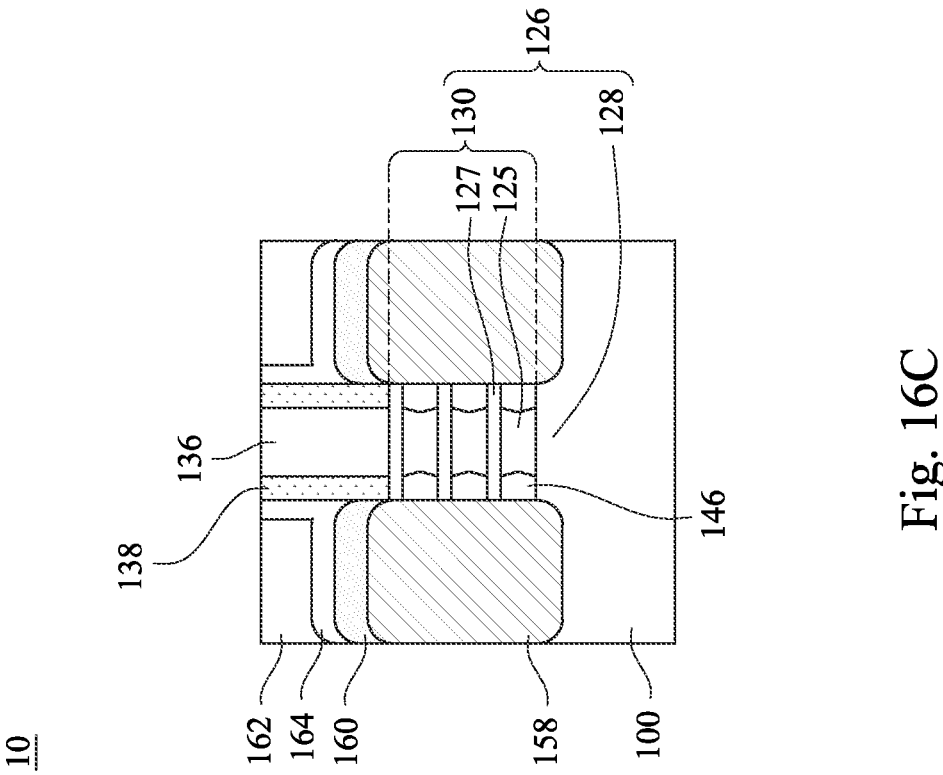
Figure 16B:
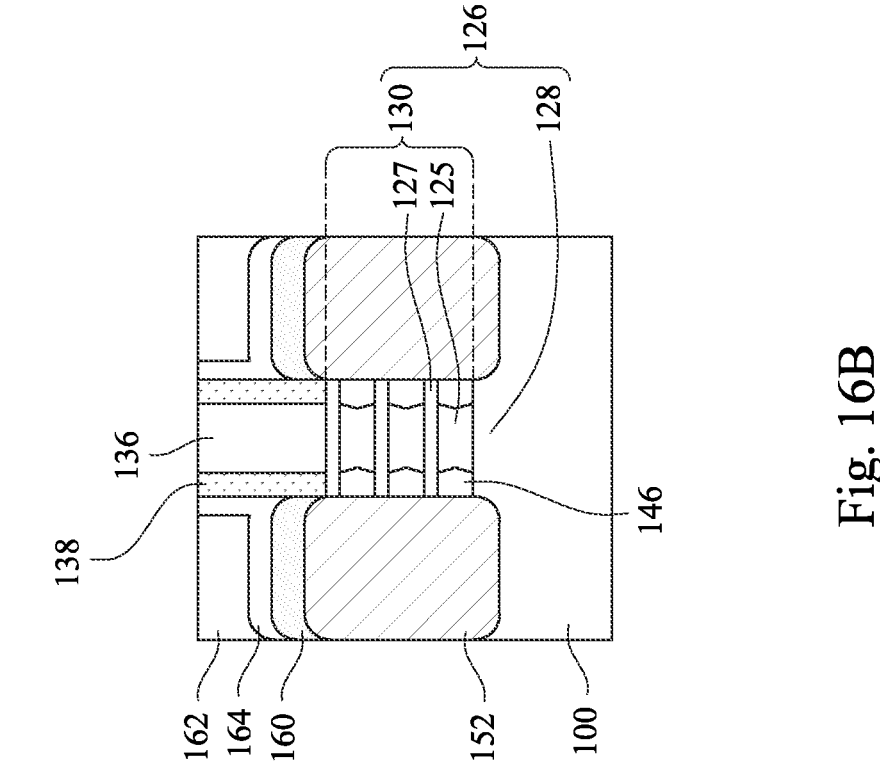
Figure 17B:
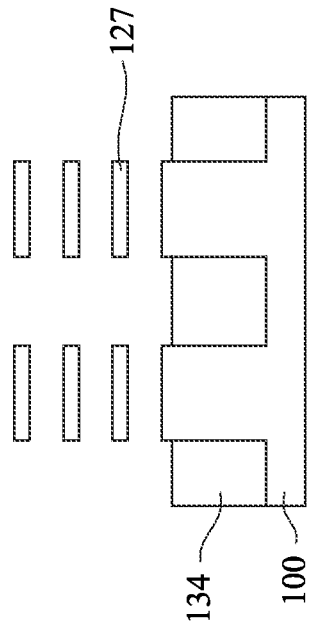
Figure 17A:
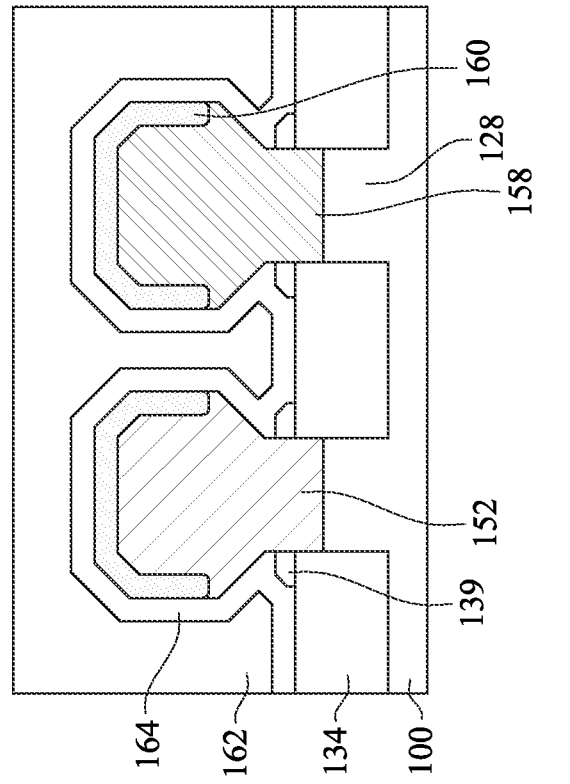
Figure 17D:
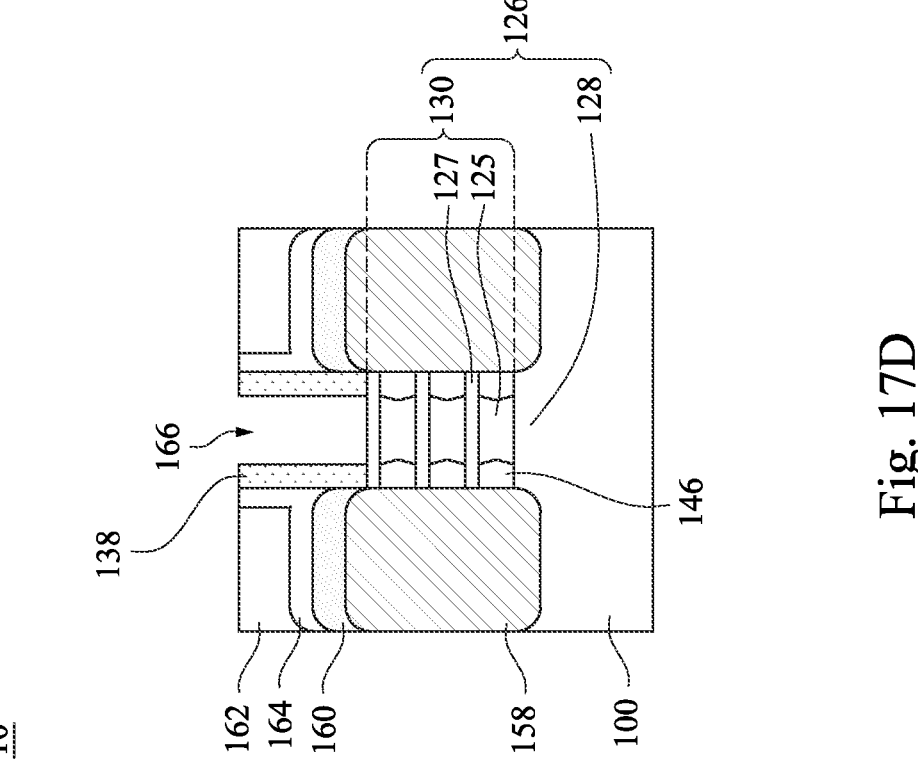
Figure 17C:
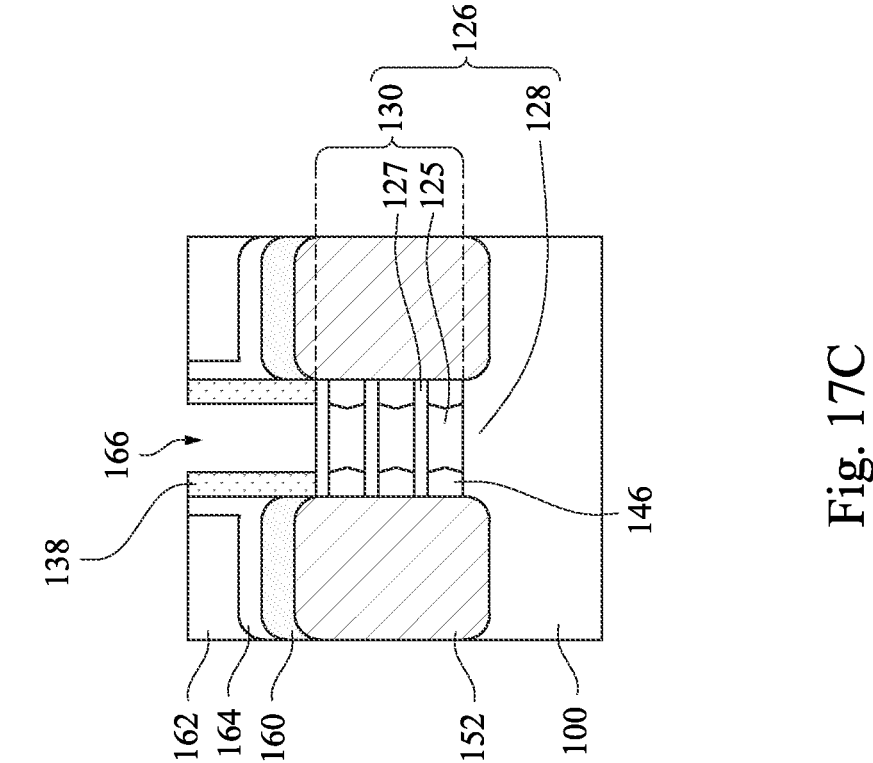
Figure 19D:
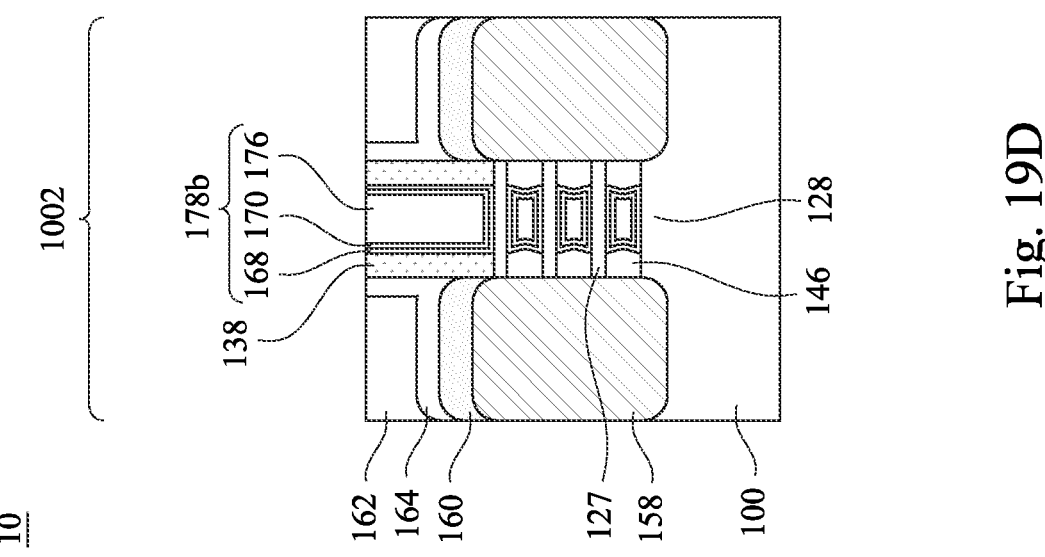
Figure 19C:
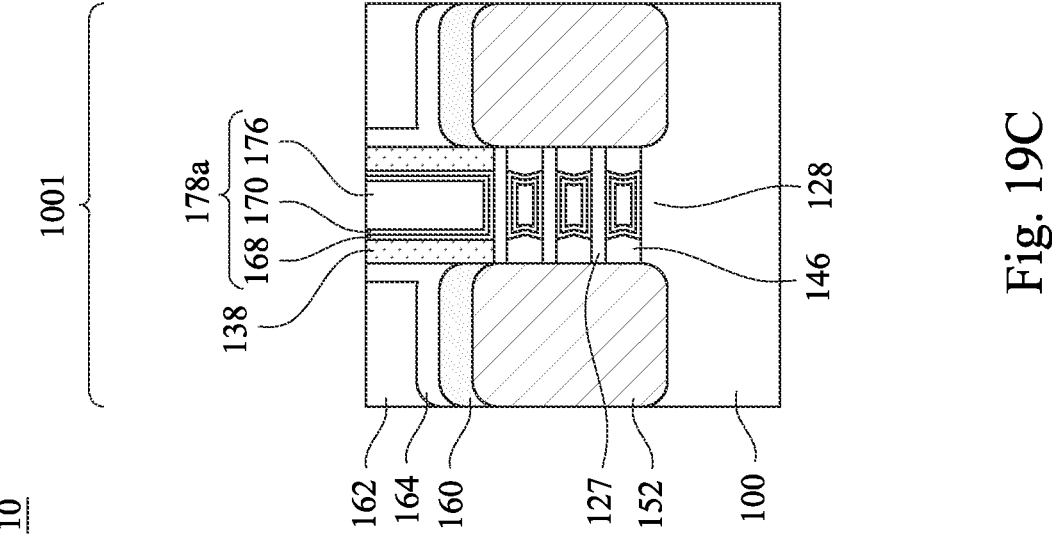

In FIGS. 16A, 16B, 16C, an interlayer dielectric (ILD) layer 162 is deposited over the structure illustrated in FIGS. 15A-15C. The ILD layer 162 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 164 is disposed between the ILD layer 162 and the epitaxial source/drain regions 152, 158, the dummy gate stack 136, and the inner spacers 146. The CESL 164 may include a dielectric material, such as, silicon nitride, silicon oxide, silicon oxynitride, or the like, having a different etch rate than the material of the overlying ILD layer 162.

A planarization process, such as a CMP, may be performed to level the top surface of the ILD layer 162 with the top surfaces of the dummy gate stacks 136. After the planarization process, top surfaces of the dummy gate stacks 136, the gate spacers 138, and the ILD layer 162 are level within process variations. Accordingly, the top surfaces of the dummy gate stacks 136 are exposed through the ILD layer 162.

In FIGS. 17A-17D, the dummy gate stacks 136 are removed in one or more etching steps, so that gate trenches 166 are formed between corresponding gate spacers 138. In some embodiments, the dummy gate stacks 136 are removed by an anisotropic dry etch process. For example, the etching process may include a dry etch process using reaction gas(es) that selectively etch the dummy gate stacks 136 at a faster etch rate than the ILD layer 162 or the gate spacers 138. Each gate trench 166 exposes and/or overlies portions of nanostructures 130, which act as channel regions in subsequently completed GAA-FETs. The nanostructures 130 which act as the channel regions are disposed between neighboring pairs of the epitaxial source/drain regions 152, 158.

The first nanostructures 125 in the gate trenches 166 are removed by an isotropic etching process such as wet etching or the like using etchants which are selective to the materials of the first nanostructures 125. Stated differently, the first nanostructures 125 are removed by using a selective etching process that etches the first nanostructures 125 at a faster etch rate than it etches the second nanostructures 127, thus forming spaces between the second nanostructures 127 (also referred to as sheet-sheet spaces if the nanostructures 130 are nanosheets). This step can be referred to as a channel release process. At this interim processing step, the spaces between second nanostructures 127 may be filled with ambient environment conditions (e.g., air, nitrogen, etc). In some embodiments, the second nanostructures 127 can be referred to as nanosheets, nanowires, nanoslabs, nanorings having nano-scale size (e.g., a few nanometers), depending on their geometry. For example, in some embodiments the second nanostructures 127 may be trimmed to have a substantial rounded shape (i.e., cylindrical) due to the selective etching process for completely removing the first nanostructures 125. In that case, the resultant second nanostructures 127 can be called nanowires.

In embodiments in which the first nanostructures 125 include, e.g., SiGe, and the second nanostructures 127 include, e.g., Si or SiC, tetramethylammonium hydroxide (TMAH), ammonium hydroxide (NH$_4$OH) or the like may be used to remove the first nanostructures 125. In some embodiments, both the channel release step and the previous step of laterally recessing first nanostructures 202 (i.e., the step as illustrated in FIG. 9B) use a selective etching process that etches first nanostructures 125 (e.g., SiGe) at a faster etch rate than etching second nanostructures 127 (e.g., Si), and therefore these two steps may use the same etchant chemistry in some embodiments. In this case, the etching time/duration of channel release step is longer than the etching time/duration of the previous step of laterally recessing first nanostructures 125, so as to completely remove the sacrificial nanostructures 125.

In FIGS. 18A and 18B, an interfacial layer 168 and a gate dielectric layer 170 are deposited conformally in the gate trenches 166 in both the first device region 1001 and the second device region 1002. The interfacial layer 168 may include an oxide-containing material such as silicon oxide or silicon oxynitride and may be formed by chemical oxidation using an oxidizing agent (e.g., hydrogen peroxide (H$_2$O$_2$), ozone (O$_3$)), plasma enhanced atomic layer deposition, thermal oxidation, ALD, CVD, and/or other suitable methods. In some embodiments, a cleaning process, such as an HF-last pre-gate cleaning process (for example, using a hydrofluoric (HF) acid solution), may be performed before the interfacial layer 168 is formed in the gate trenches 166. The gate dielectric layer 170 wraps around the second nanostructures 127. In some embodiments, the gate dielectric layer 170 includes high-k dielectric material having a high dielectric constant, for example, greater than that of thermal silicon oxide (~3.9). The high-k dielectric material may include hafnium oxide (HfO$_2$), zirconium oxide (ZrO$_2$), lanthanum oxide (La$_2$O$_3$), aluminum oxide (Al$_2$O$_3$), titanium oxide (TiO$_2$), yttrium oxide, strontium titanate, hafnium oxynitride (HfO$_x$N$_y$), other suitable metal-oxides, or combinations thereof. The gate dielectric layer 170 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

In FIGS. 18A and 18B, one or more p-type work function metal layers 172 are deposited on the gate dielectric layer 170. The one or more p-type work function metal layers 172 may include one or more work function metals to provide a suitable work function for the high-k/metal gate structures. The one or more p-type work function metal layers 172 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

A photoresist layer 174 is then formed over the p-type work function metal layers 172 and patterned to expose the first device region 1001 but not expose the second device region 1002. In some embodiments, the photoresist layer 174 is an organic material formed using a spin-on coating process, followed by patterning the organic material to expose the first device region 1001 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation.

After the patterned photoresist layer 174 is formed, the exposed p-type work function metal layers 172 in the first device region 1001 are removed by using the patterned photoresist layer 174 as an etch mask, so that the gate dielectric layer 170 is exposed in the first device region 1001. In some embodiments, the p-type work function metal layers 172 may be etched by using a plasma dry etching using fluorine-based and/or chlorine-based etchants. For example, the p-type work function metal layers 172 may be removed by a wet etching process using an etchant that is selective to the material of the p-type work function metal layers 172. Stated differently, the etchant used in removing the p-type work function metal layers 172 etches the material of the p-type work function metal layers 172 at a faster etch rate than etching the material of the gate dielectric layer 170.

Next, the photoresist layer 174 is removed from the second device region 1002 by using, for example, a plasma ash process. In some embodiments, a plasma ash process is performed such that the temperature of the organic material of the photoresist is increased until these organic materials experience a thermal decomposition and may be removed.

In FIGS. 19A-19D, one or more n-type work function metal layers 176 are deposited on the gate dielectric layer 170 in the first device region 1001, and on the one or more p-type work function metal layers 172 in the second device region 1002.

The one or more n-type work function metal layers 176 may include one or more work function metals to provide a suitable work function for the high-k/metal gate structures. The one or more n-type work function metal layers 176 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials.

A CMP is then performed. The one or more n-type work function metal layers 176, and the corresponding gate dielectric layer 170 and interfacial layer 168 may be collectively referred to as a metal gate stack 178a. The one or more p-type work function metal layers 172, and the corresponding gate dielectric layer 170 and interfacial layer 168 may be collectively referred to as a metal gate stack 178b.

In FIGS. 20A and 20B, a cut metal gate (CMG) isolation structure 180 is formed to separate the metal gate stacks 178a. 178b. Formation of the CMG isolation structure 180 may include forming a cut metal gate trench extending into the STI regions 134 to ensure that the metal gate stack 178a and the metal gate stack 178b are isolated from each other. A dielectric material then fills into the cut metal gate trench followed by preforming a CMP to level up top surfaces of the one or more n-type work function metal layers 176, the one or more p-type work function metal layers 172 and the dielectric material.

Figure 21B:
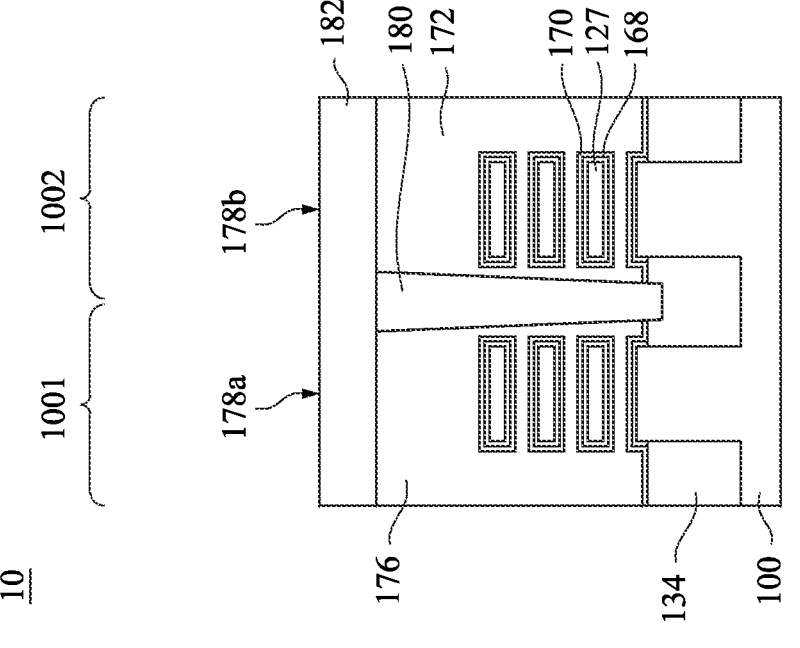
Figure 21A:
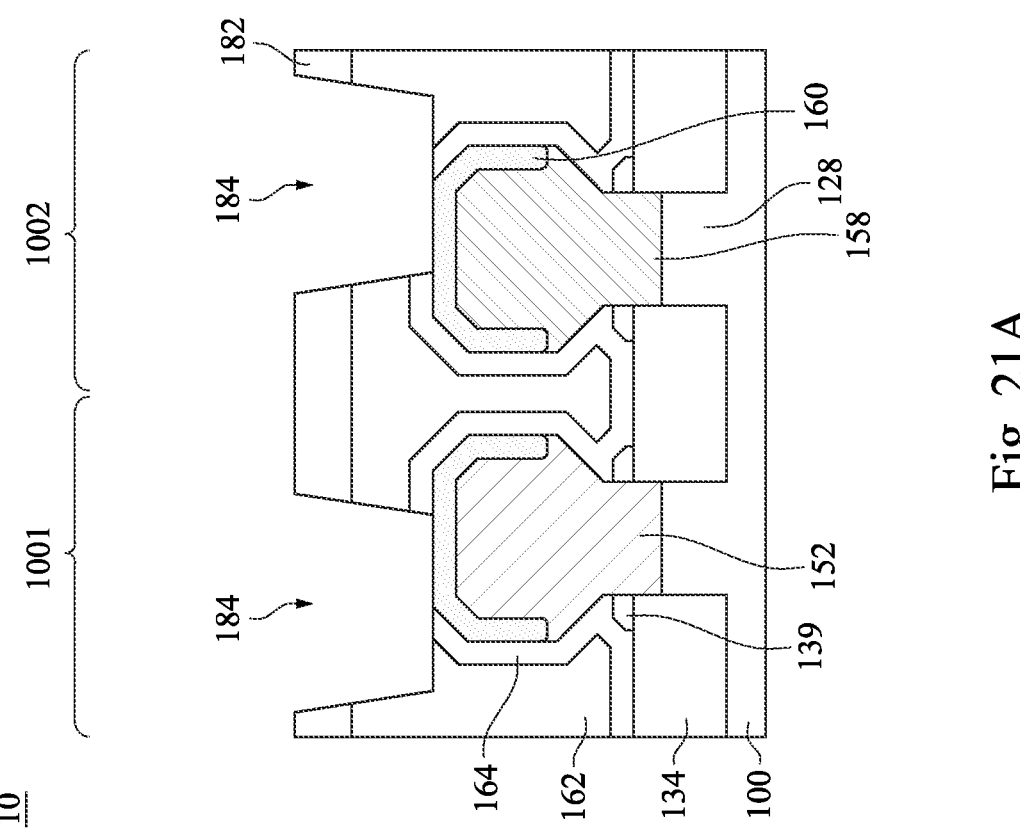

Reference is made to FIGS. 21A and 21B. An interlayer dielectric (ILD) layer 182 is then formed over the ILD layer 162, the metal gate stacks 178a, 178b and the CMG 180. The ILD layer 182 may be similar to the ILD layer 162 in terms of composition and formation method. Next, contact holes 184 are formed through the ILD layer 182, the ILD layer 162 and the CESL 164 to expose the first silicide layer 160. Formation of the contact holes 184 may include patterning the ILD layer 182, the ILD layer 162 and the CESL 164 by a photolithography process, etching the exposed ILD layer 182 by a first etch process (for example, by using a dry etching, wet etching, and/or plasma etching process) to remove portions of the ILD layer 182, the ILD layer 162 and the CESL 164 over the first silicide layer 160. During the first etch process, the first silicide layer 160 may function as an etch stop layer, such that the first etch process is tuned to selectively etch the ILD layers 182, 162 and the CESL 164 but not etch the first silicide layer 160.

Figure 22B:
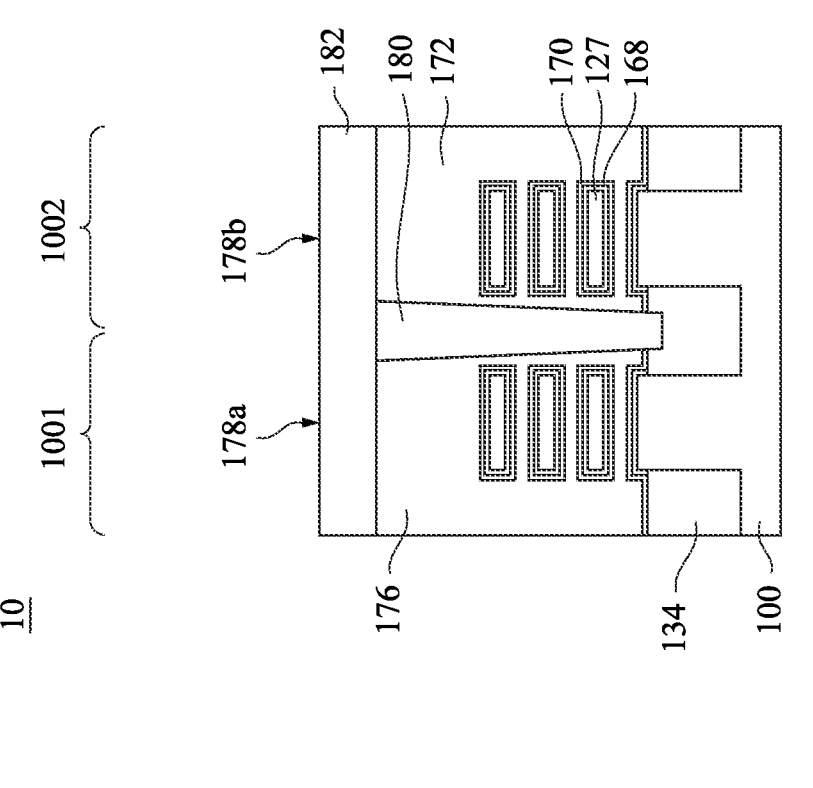
Figure 22A:
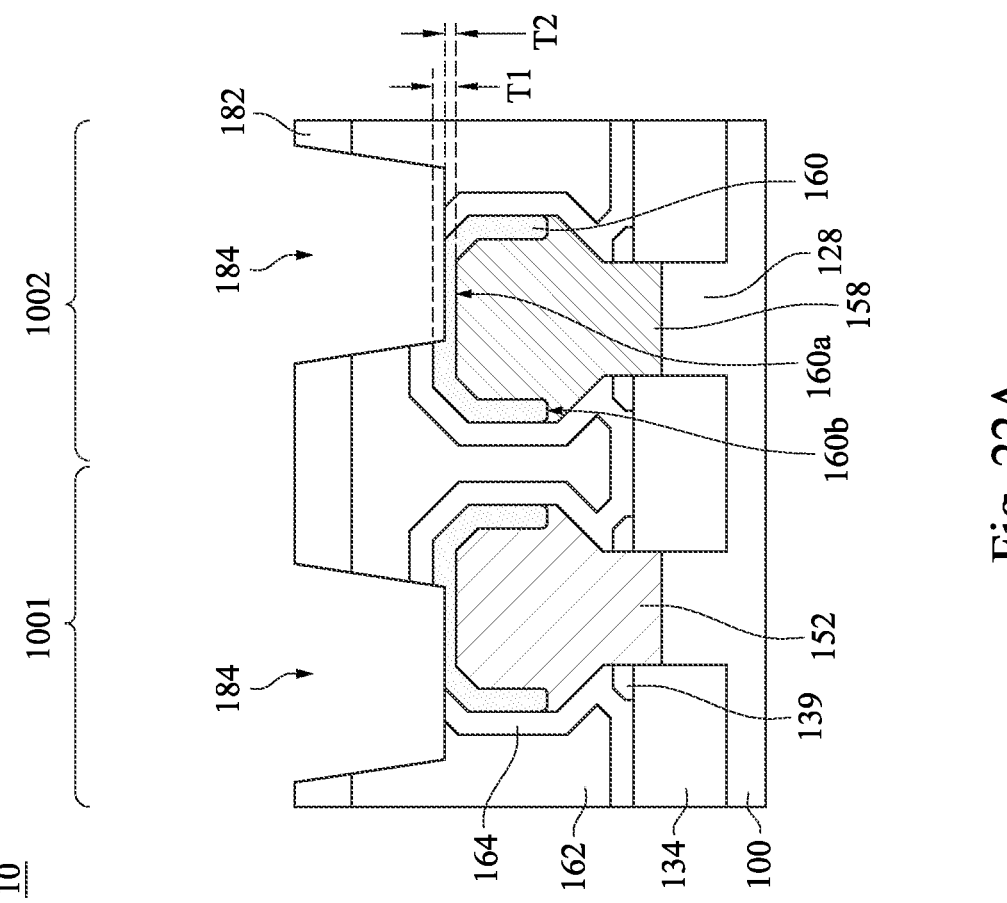

Reference is made to FIGS. 22A and 22B. A subsequent second etch process is performed to etch the first silicide layer 160 without substantially etching the ILD layers 182, 162 and the CESL 164 such that a top portion of the first silicide layer 160 is removed. In other words, the contact holes 184 extend vertically though the first silicide layer 160. The ILD layers 182, 162 and the CESL 164 have sidewalls facing the contact holes 184.

The second etch process is performed such that the first silicide layer 160 has a thinned portion 160a having a reduced thickness T2. The thinned portion has a thickness T2 less than the thickness T1 of an un-etched portion 160b of the first silicide layer 160. The un-etched portion 160b are, for example, a corner portion being in contact with a corner of the epitaxial source/drain regions 152 or the epitaxial source/drain regions 158 and a side portion being in contact with the sidewall of the epitaxial source/drain region 152 or the epitaxial source/drain regions 158. In some embodiments, the thickness T2 is in a range from 2 nm to 8 nm. The thinned portion 160a of the first silicide layer 160 and the un-etched portion 160b of the first silicide layer 160 have a thickness difference in a range from about 1 nm to about 5 nm. In other words, the difference between the thickness T1 and the thickness T2 is in a range from about 1 nm to about 5 nm. The un-etched portion 160b can be referred to as an un-thinned portion.

Reference is made to FIGS. 23A-23D, one or more conductive materials fill into the contact holes 184 followed by a CMP process to remove excessive portions of the conductive materials, forming metal contacts 186. The conductive materials may include copper (Cu), aluminum (Al), tungsten (W), copper, copper magnesium (CuMn), copper aluminum (CuAl) or copper silicon (CuSi), and/or other suitable conductive material. The conductive materials may be formed by PVD, CVD, metal-organic chemical vapor deposition (MOCVD), or plating. The metal contacts 186 have an upper sidewall USW and a lower sidewall LSW connecting a bottommost surface BS1 of the metal contacts 186. The lower sidewall LSW can be referred to as a bottommost sidewall. The upper sidewall USW is in contact with the ILD layer 182, the ILD layer 162 and the CESL 164 while the lower sidewall LSW is in contact with the first silicide layer 160. That is, a bottom of the metal contacts 186 is embedded in the first silicide layer 160. The bottommost surface BS1 of the metal contact 186 is lower than a topmost position of the first silicide layer 160.

Figure 23B:
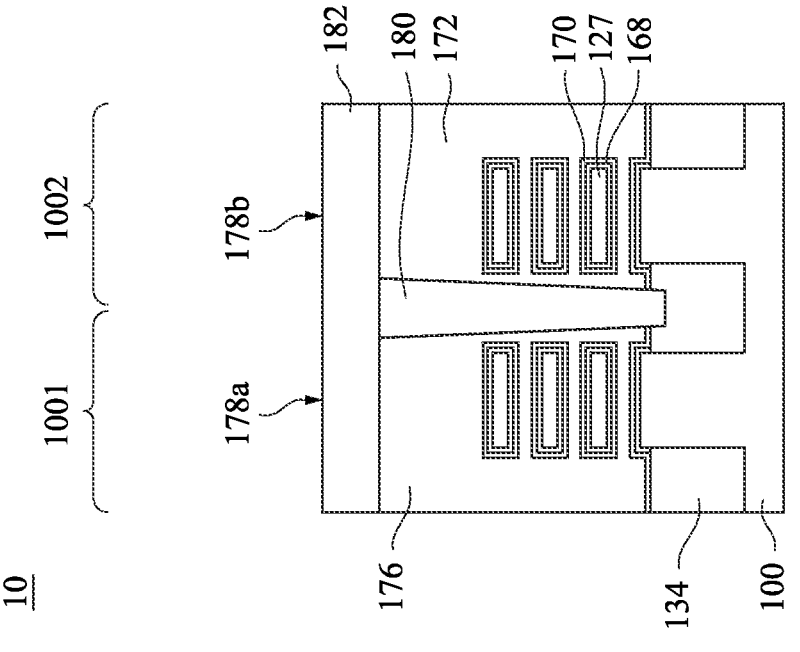
Figure 23A:
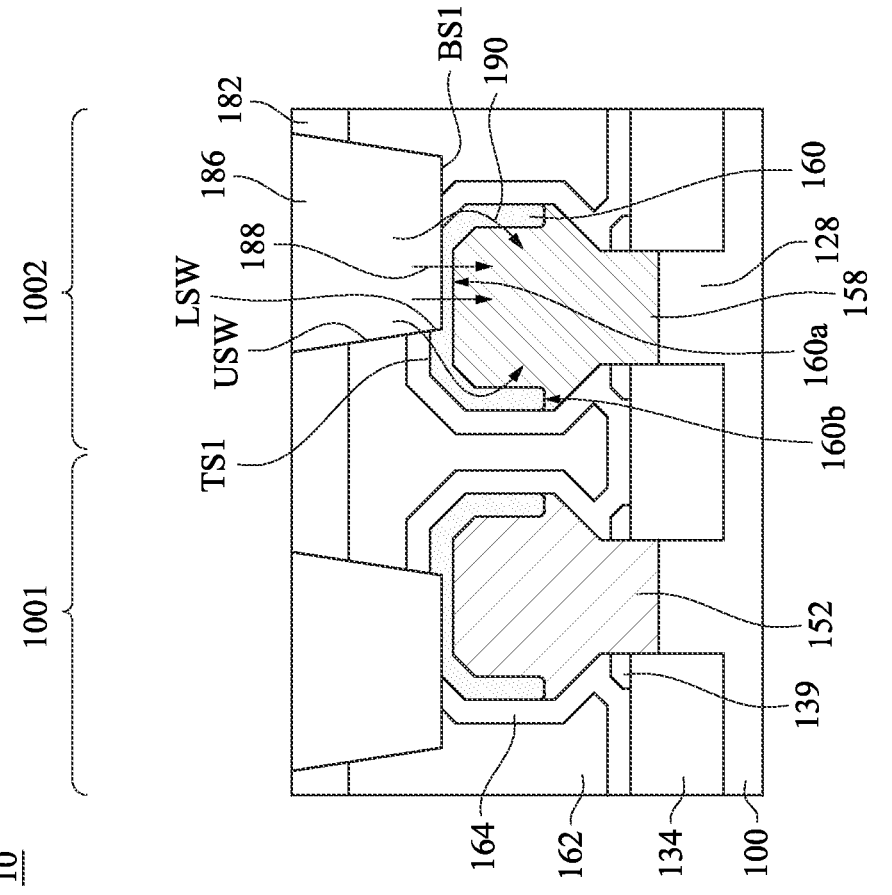
Figure 23D:
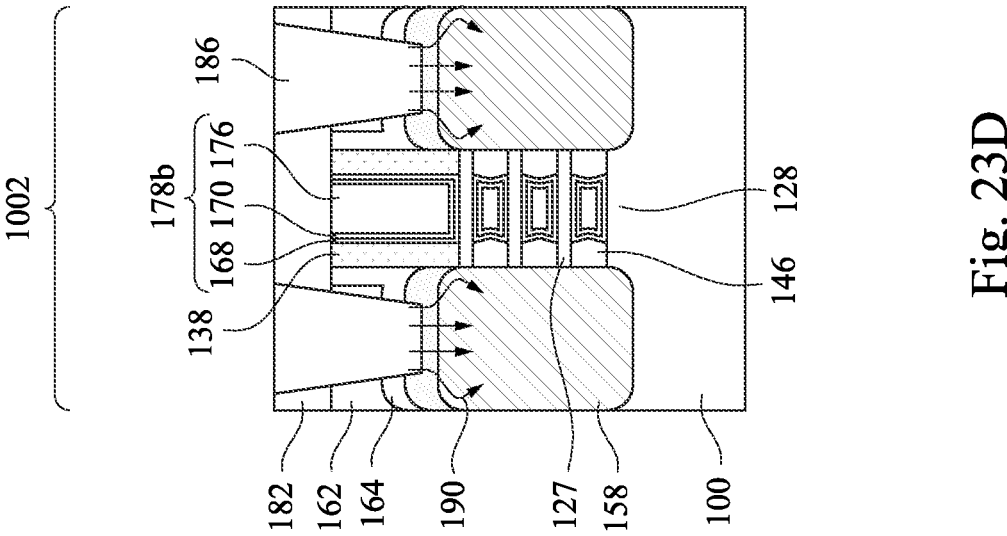
Figure 23C:
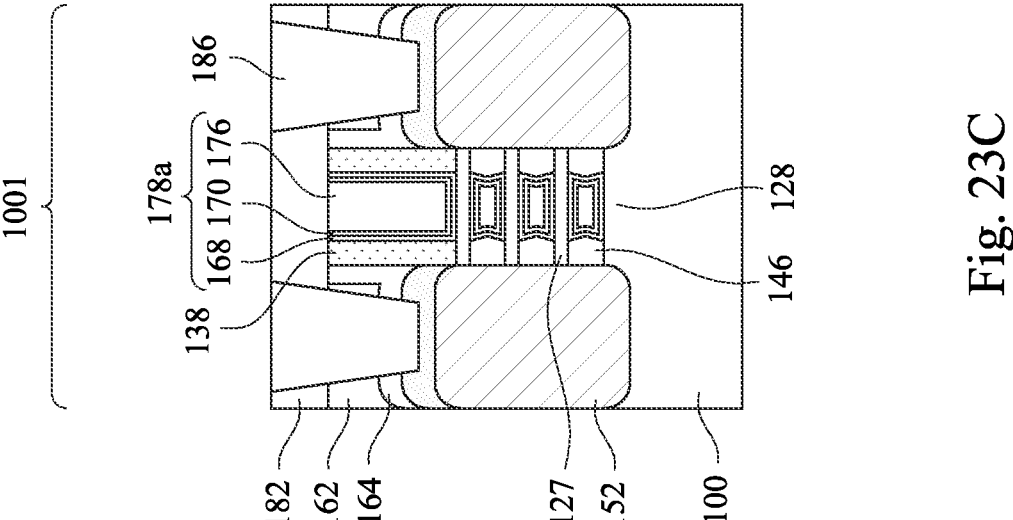

In FIGS. 23A and 23D, two current paths in the second device region 1002 are illustrated in accordance with some embodiments. For example, a first current path 188 and a second current path 190 are illustrated. The first current path 188 takes a short path (or direct path). Due the thinned portion 162a with the reduced thickness T2 (see FIG. 23A), a contact resistance of the first current path 188 between the metal contact 186 and the thinned portion 160*a* of the first silicide layer 160 is reduced. In other words, the first current path 188 has a low contact resistance. The second current path 190 is a spreading current path. Due to the un-etched portion 160*b* (i.e., the side portion and the corner portion of the first silicide layer 160) with the intact thickness T1 and with the C49-TiSi$_2$ phase or the C54-TiSi$_2$ phase, which has low sheet resistance (Rs), the second current path 190 has a low sheet resistance. The current path in the first device region 1001 is similar in the first current path 188 and the second current path 190 and is omitted in FIGS. 23A and 23D.

Figure 24A:
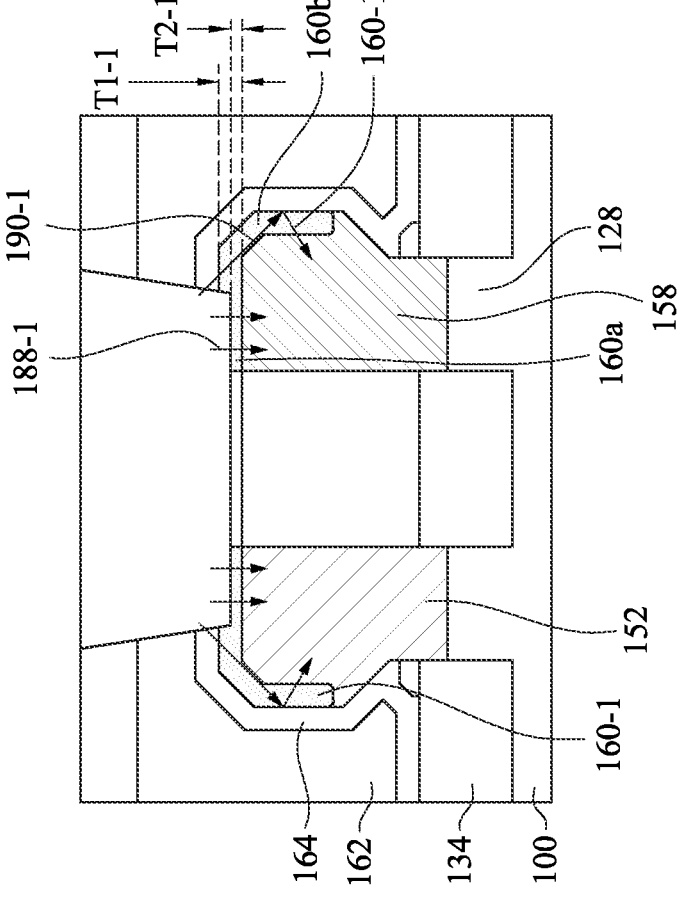
Figure 24C:
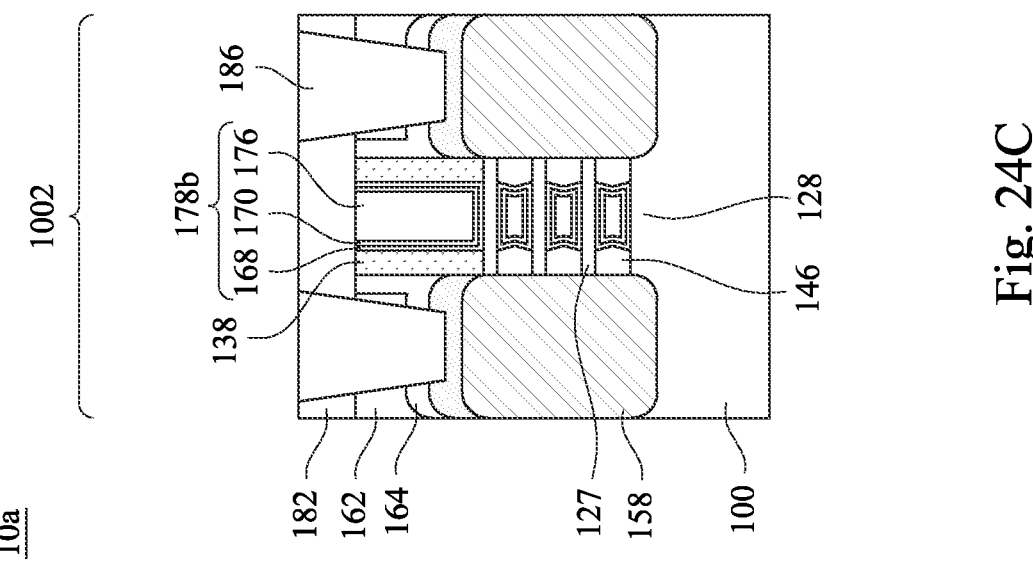
Figure 24B:
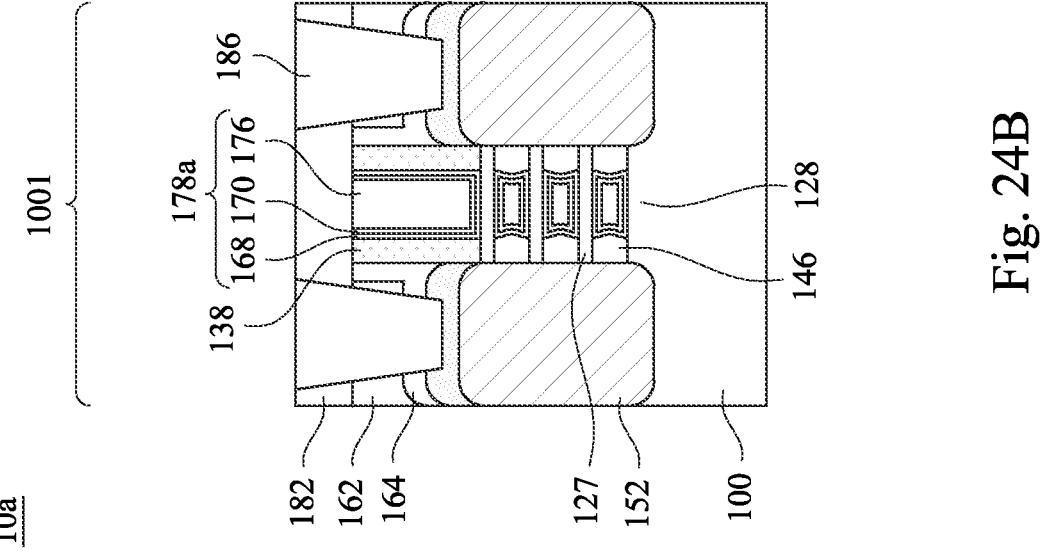

FIGS. 24A-24C show an NSFET 10*a* with a forksheet structure in accordance with some embodiments. In FIGS. 24A-24C, a dielectric fin 192 is formed between the epitaxial source/drain regions 152, 158 in accordance with some embodiments. A pair of the epitaxial source/drain regions 152, 158 and the dielectric fin 192 can be referred to as a fork-sheet structure. In some embodiments, the dielectric fin 192 includes SiN, SiCN, SiOC, SiOCN, or the like. In some embodiment, the dielectric fin 192 may be a multi-layer structure. Due to the dielectric fin 192, the epitaxial source/drain regions 152, 158 grown to have an asymmetric shape. Therefore, the first silicide layer 160-1 has an asymmetric shape as well. The first silicide layer 160-1 has a thinned portion 160*a* and an un-etched portion 160*b*, as discussed previously with regard to FIG. 22A. The thinned portion 160*a* has a thickness T2-1 less than a thickness T1-1 of the un-etched portion 160*b*. Two current paths are illustrated in accordance with some embodiments. For example, a first current path 188-1 and a second current path 190-1 are illustrated. The first current path 188-1 is a direct path and is similar to the first current path 188, and the second current path 190-2 is a spreading current path and is similar to the second current path 190 as discussed previously with regard to FIG. 23A.

Figures 25, 26:
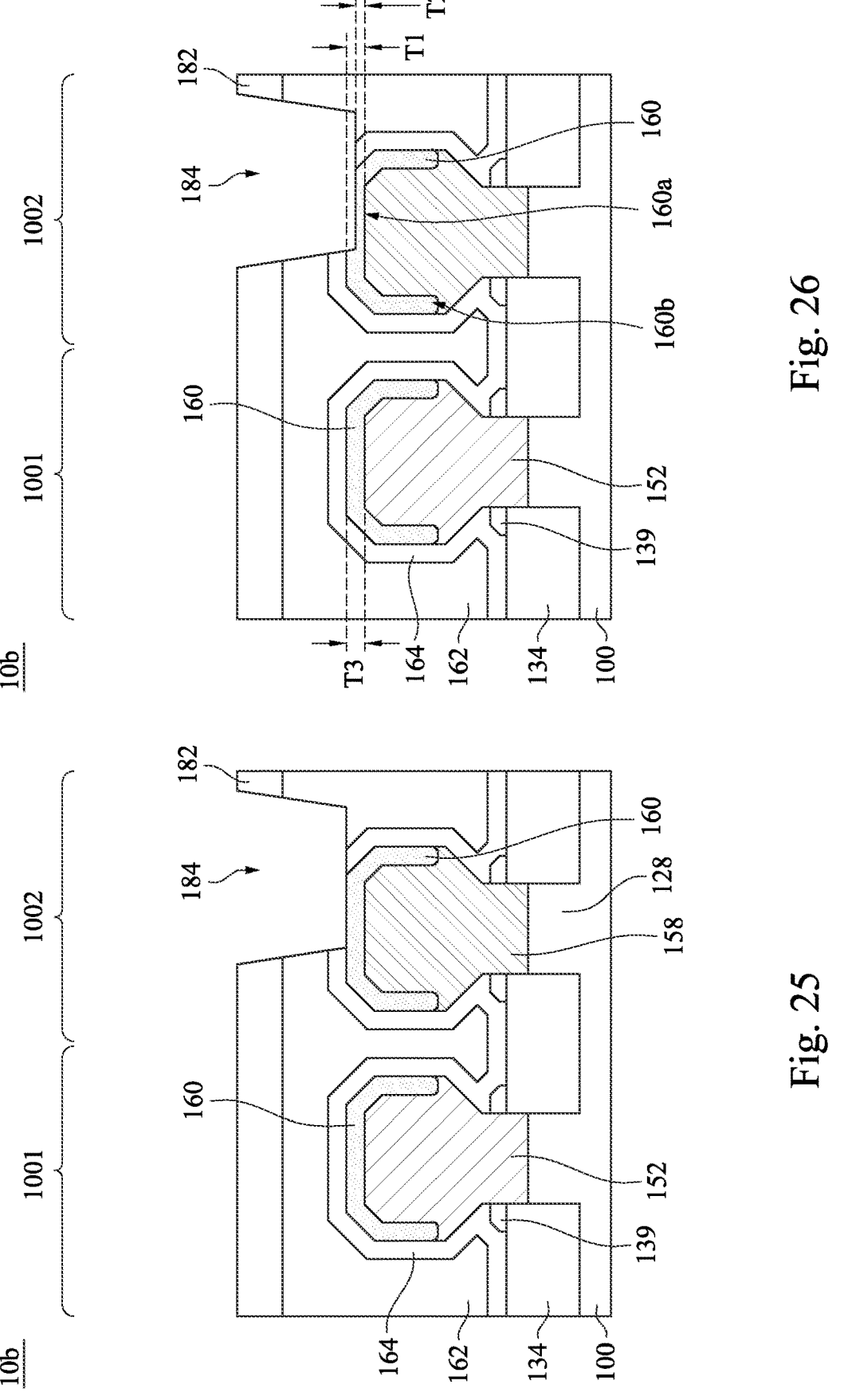
Figure 27B:
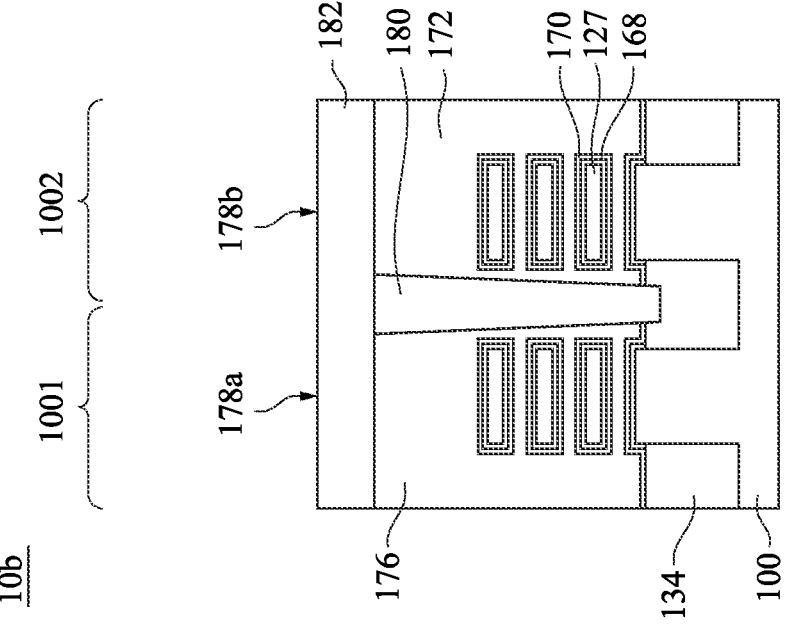
Figure 27A:
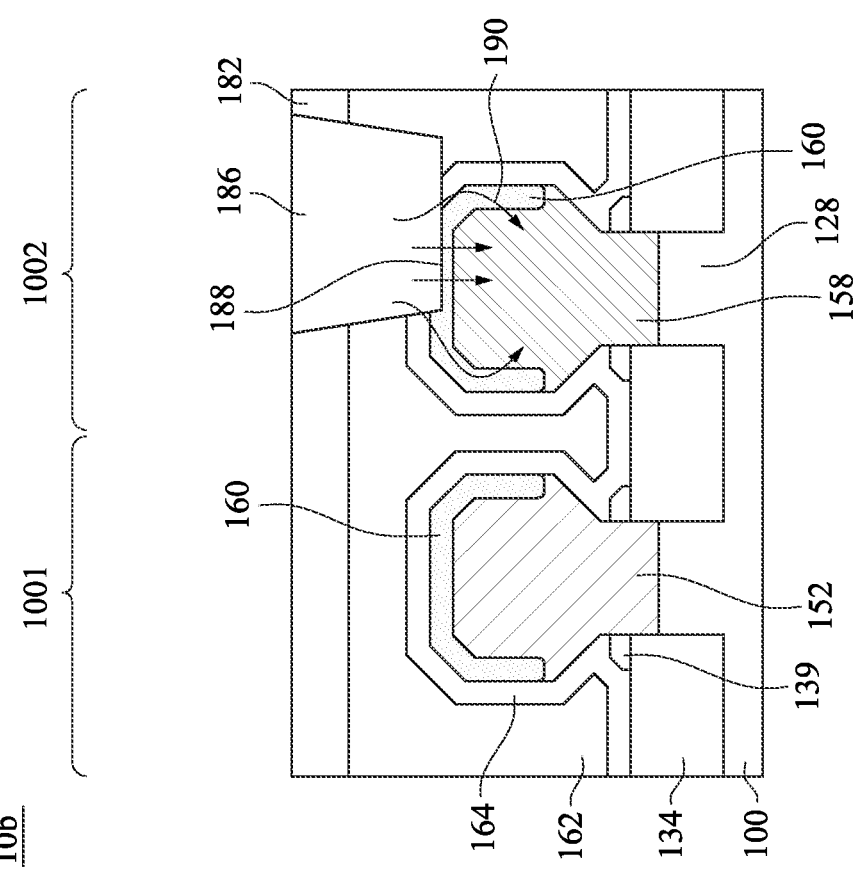

FIGS. 25, 26, 27A and 27B show cross-sectional views of a nanosheet field-effect transistor (NSFET) device 10*b* at various stages of manufacturing, in accordance with an embodiment. Reference is made to FIG. 25. A contact hole 184 is formed through the ILD layer 182, the ILD layer 162, and the CESL 164 to expose the first silicide layer 160 by a first etch process. This embodiment is similar to the previous embodiment described in FIG. 21A, except for the contact hole being absent over the epitaxial source/drain region 152, which is in the first device region 1001. In FIG. 26, a subsequent second etch process is performed to etch the first silicide layer 160 without substantially etching the ILD layers 182, 162 and the CESL 164 such that a top portion of the first silicide layer 160 is removed. The second etch process is performed such that the first silicide layer 160 has a thinned portion 160*a* having a reduced thickness T2. The thinned portion has a thickness T2 less than the thickness T1 of an un-etched portion 160*b* of the first silicide layer 160. In this case, the first silicide layer 160 in the first device region 1001 has a thickness T3 substantially the same as the thickness T1 of the un-etched portion 160*b* of the first silicide layer 160 in the second device region 1002. Referring to FIGS. 27A and 27B, a metal contact 186 is formed in the contact hole 184, as discussed previously with respect to FIG. 22A.

Figure 28B:
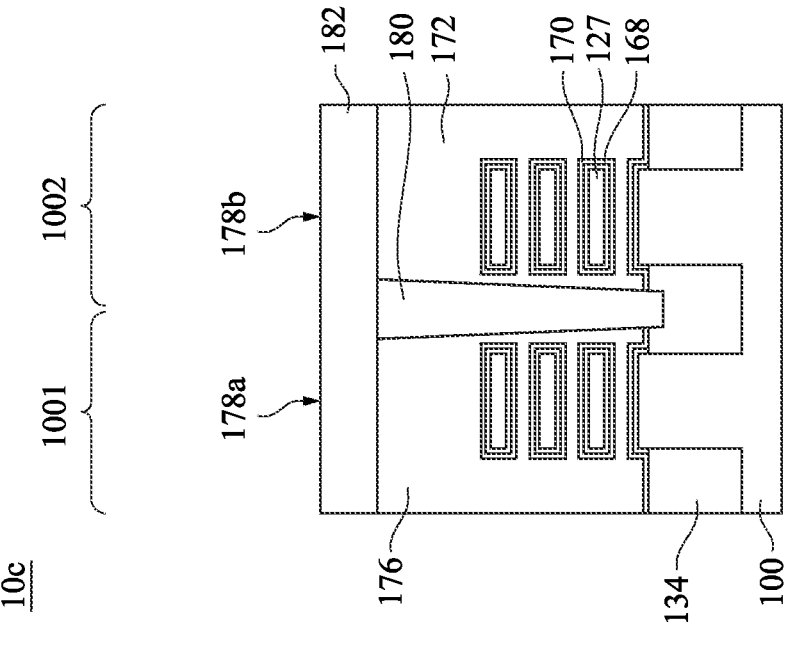
Figure 28A:
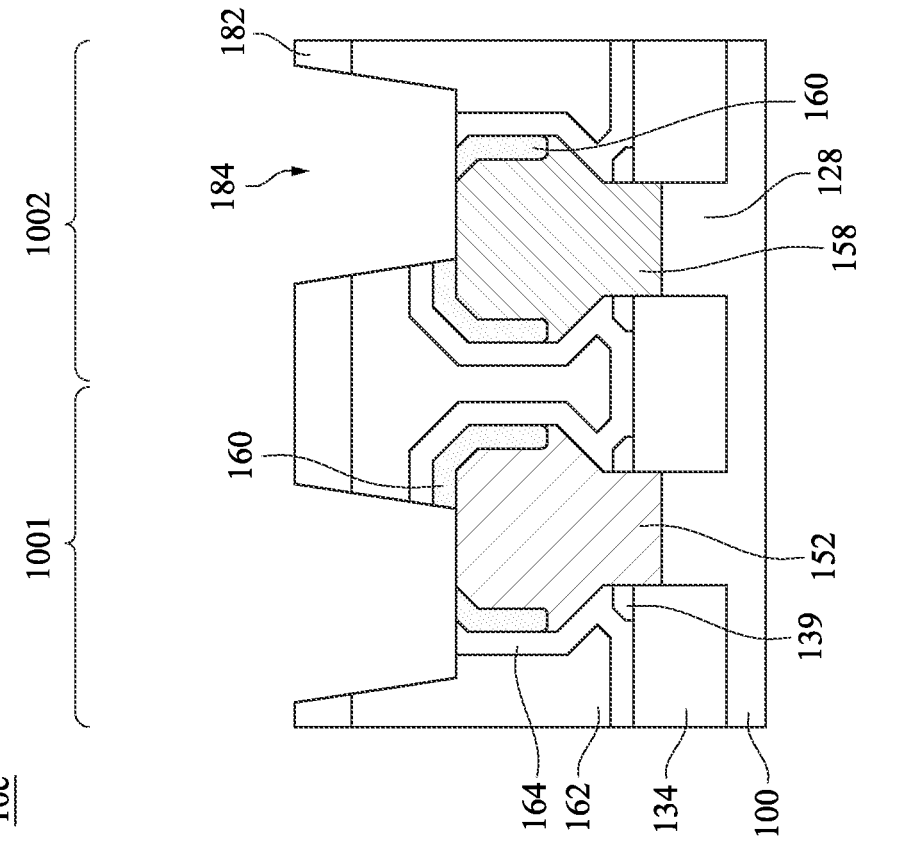
Figure 28C:
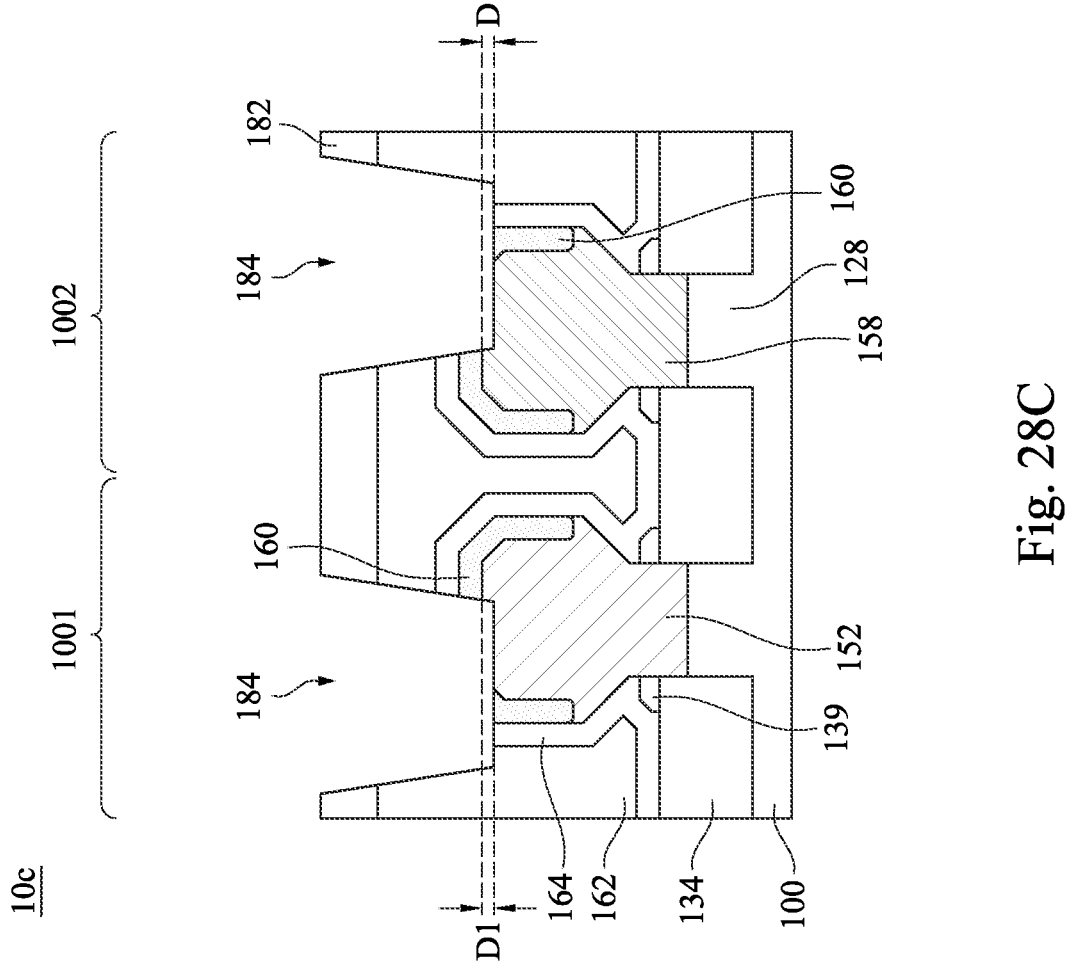

FIGS. 28A, 28B, 29A, 29B, 30A and 30B show cross-sectional views of a nanosheet field-effect transistor (NSFET) device 10*c* at various stages of manufacturing, in accordance with an embodiment. This embodiment is similar to the previous embodiment described in FIG. 22A, except for the second etch process being performed to remove a portion of the first silicide layer 160 to expose the epitaxial source/drain regions 152, 158. In FIGS. 28A-28B, the epitaxial source/drain regions 152, 158 are exposed by the contact holes 184. In some other embodiments, in FIG. 28C, the contact holes 184 may extend a first distance D1 through the epitaxial source/drain regions 152, 158. The distance D1 is in a range from 10 nm to 50 nm. In some embodiments, the first distance D1 is in a range from 2 nm to 10 nm.

Figure 29B:
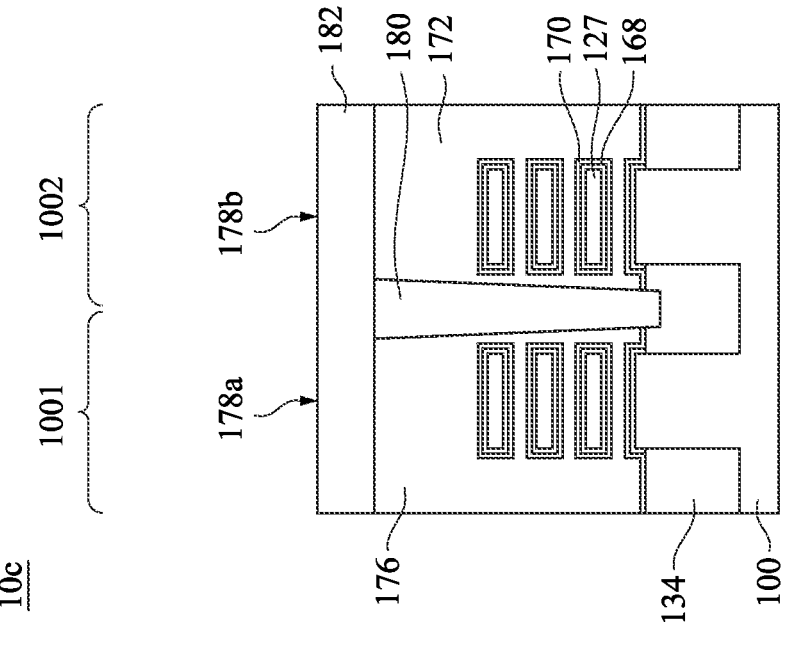
Figure 29A:
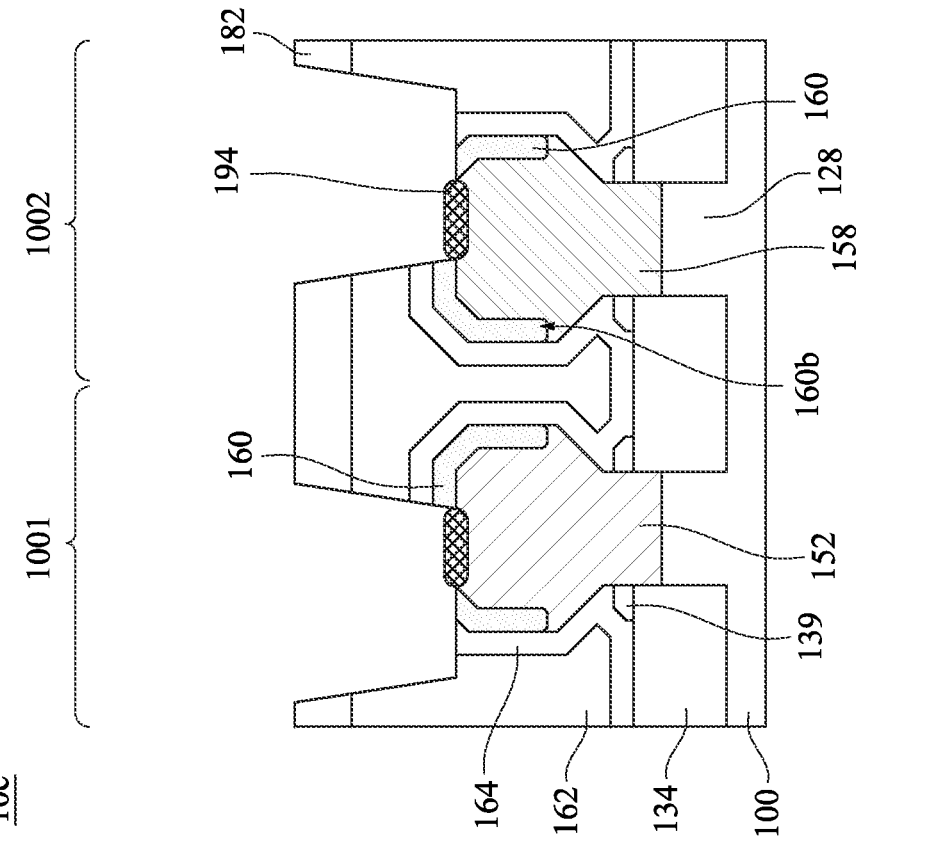

In FIGS. 29A and 29B, a second silicide layer 194 is formed on the exposed epitaxial source/drain regions 152, 158 to reduce the contact resistance between the epitaxial source/drain regions 152, 158 and subsequently formed source/drain contacts. Since the second silicide layer 194 is formed after forming a metal gate stack (i.e., the metal gate stacks 178*a*. 178*b*), it is referred to as a silicide-last scheme. The second silicide layer 194 may include materials such as TiSi$_x$, NiSi$_x$, CoSi$_x$, MoSi$_x$, PtSi$_x$, TiSi$_x$ Ge$_y$, NiSi$_x$ Ge$_y$, CoSi$_x$ Ge$_y$, MoSi$_x$Ge$_y$, PtSi$_x$Ge$_y$, the like, or a combination thereof.

The second silicide layer 194 may be formed by silicidation such as self-aligned silicide process (Salicide), in which a metal is deposited, reacted with the exposed epitaxial source/drain regions 152, 158 during an annealing process, and then the unreacted metal is removed by etch. For example, after the deposition of the metal, a temperature is raised to during the annealing process to enhance a reaction between the epitaxial source/drain regions 152, 158 and the metal to form the second silicide layer 194. In some embodiments, the deposition of the metal may include a sputtering deposition. The second silicide layer 194 covers a top of the epitaxial source/drain regions 152, 158 without covering a sidewall of the epitaxial source/drain regions 152, 158.

In some embodiments, the first silicide layer 160 and the second silicide layer 194 has the same material with different phases. For example, the first silicide layer 160 has a silicide phase different from a silicide phase of the second silicide layer 194. In some embodiments where the second silicide layer 194 includes TiSi$_x$, the second silicide layer 194 may have a Ti$_5$i$_4$ phase, which has a low contact resistance as compared to the TiSi$_x$ with the C49-TiSi$_2$ phase or the C54-TiSi$_2$ phase. For example, the second silicide layer 194 has a contact resistance equal to about 2E-9 Ohm-cm$^2$ or lower than about 2E-9 Ohm-cm$^2$, which is beneficial for reducing the contact resistance between the subsequently formed metal contact and the second silicide layer 194. The first silicide layer 160 and the epitaxial source/drain regions 152, 158 have a contact area greater than a contact area between the second silicide layer 194 and the epitaxial source/drain regions 152, 158.

Figure 30A:
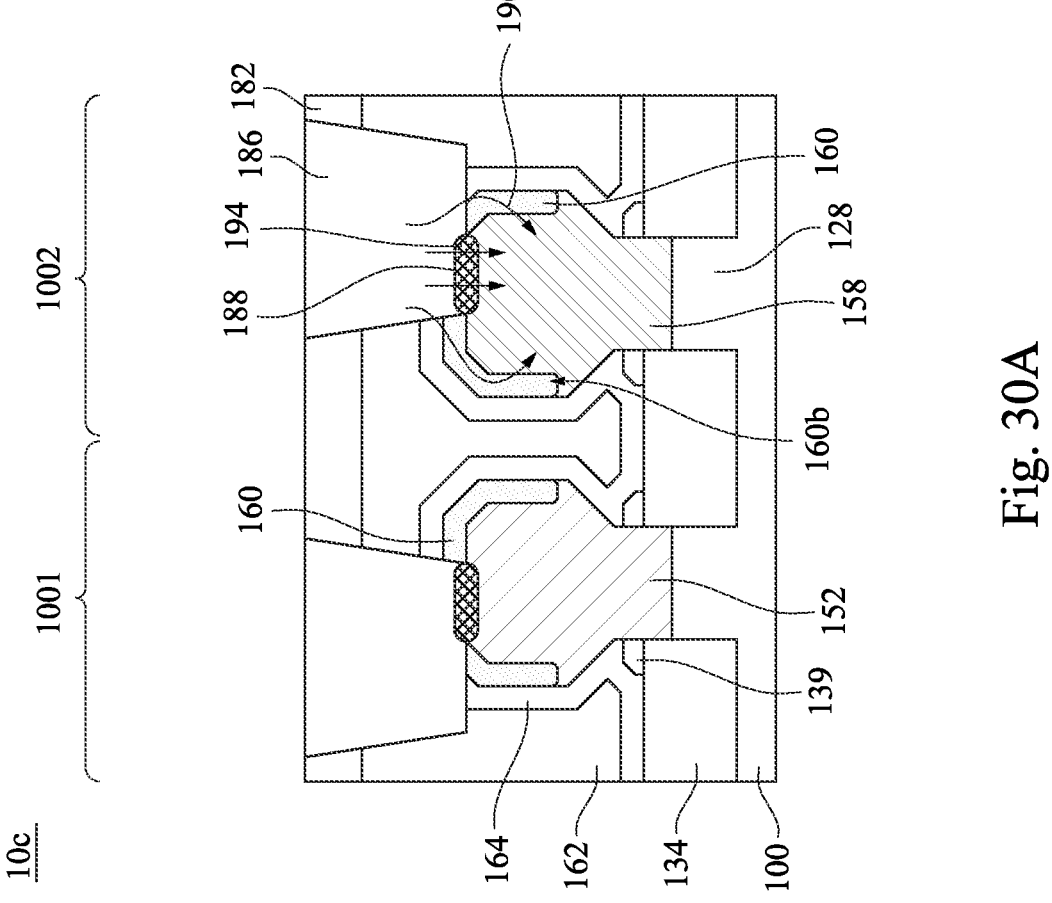
Figure 30C:
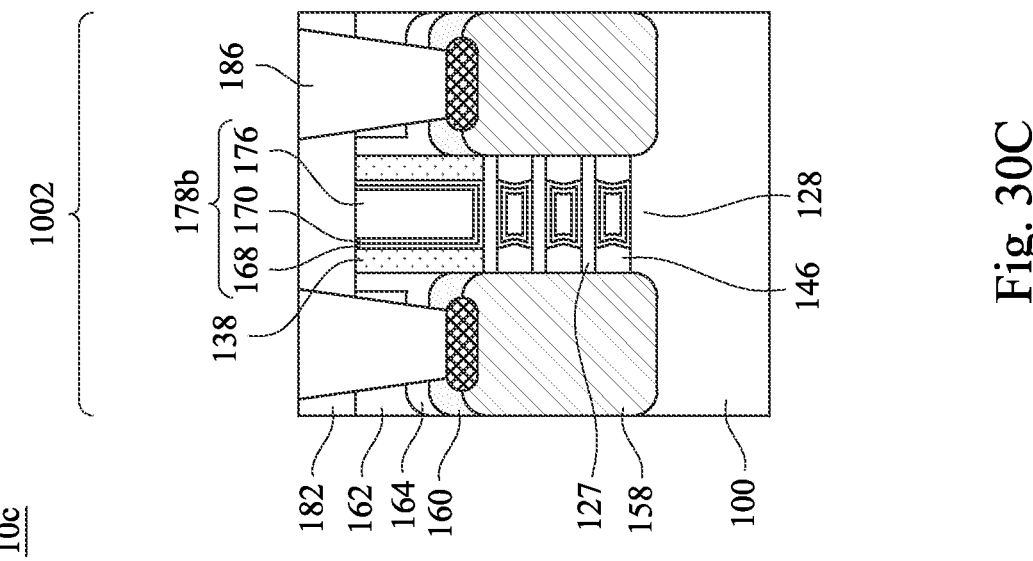
Figure 30B:
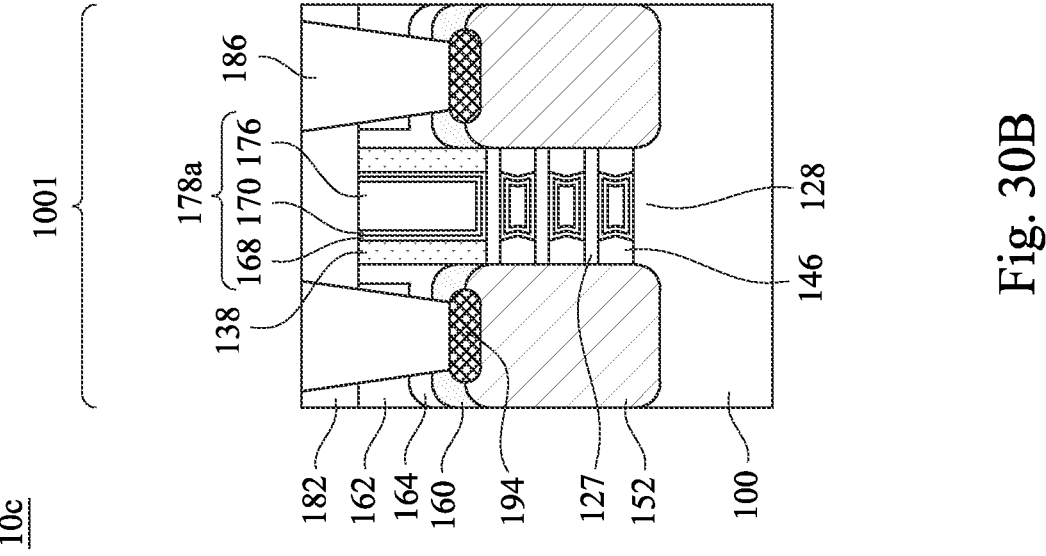

In FIGS. 30A-30C, one or more conductive materials fill into the contact holes 184 followed by a CMP process to remove excessive portions of the conductive materials, forming metal contacts 186, as discussed previously with regard to FIGS. 23A-23B. Two current paths in the second device region 1002 are illustrated in accordance with some embodiments. Due to the Ti$_5$Si$_4$ phase having a contact resistance lower than a contact resistance of the C49-TiSi$_2$ phase and a C54-TiSi$_2$ phase, the contact resistance of the first current path 188 between the metal contact 186 and the second silicide layer 194 can be reduced.

Figures 31A, 31B:
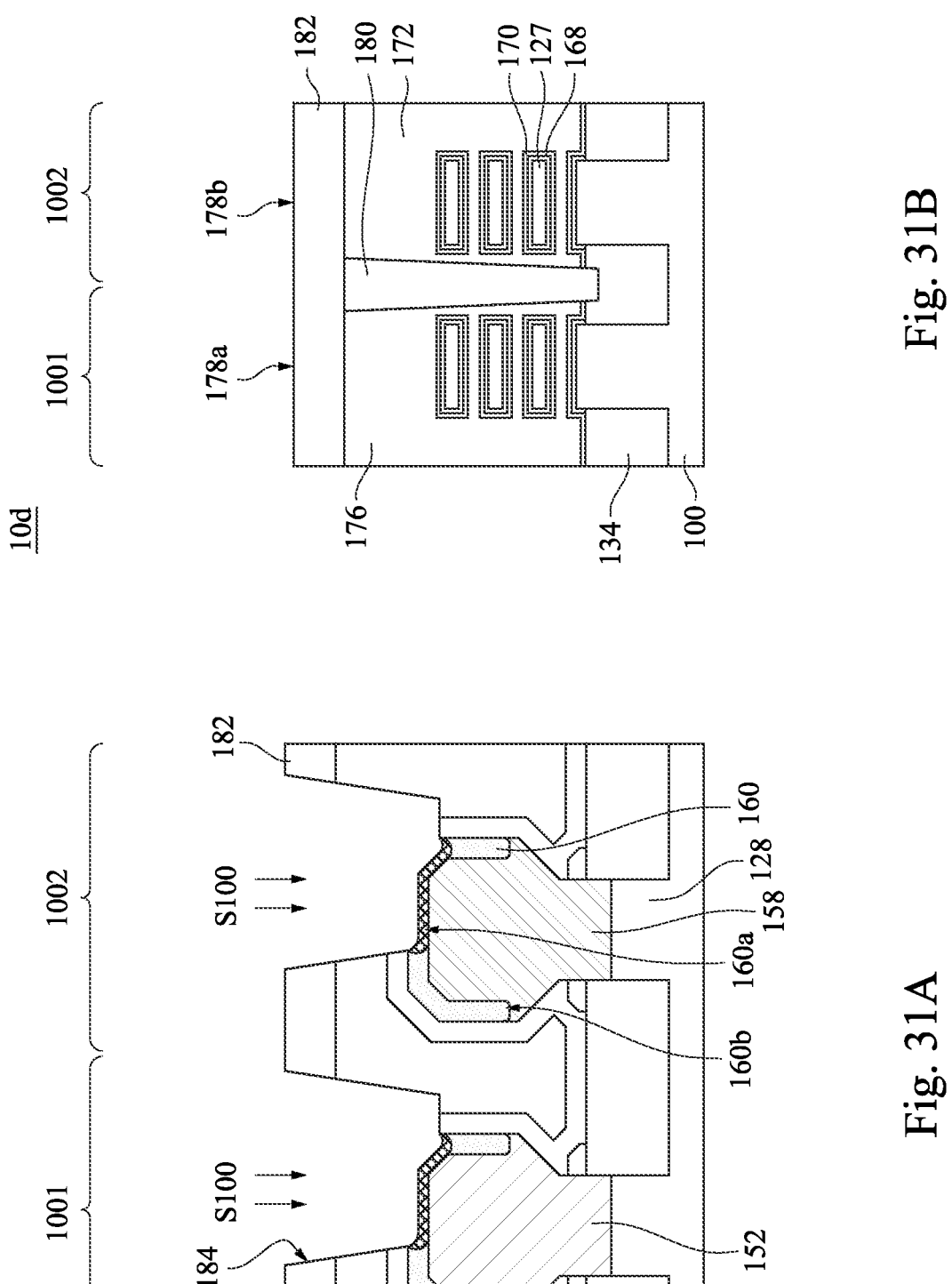

FIGS. 31A. 31B, 32A, and 32B show cross-sectional views of a nanosheet field-effect transistor (NSFET) device 10*d* at various stages of manufacturing, in accordance with an embodiment. FIGS. 31A and 31B illustrate the resulting structure after the contact holes 184 are formed. Reference is made to FIGS. 31A and 31B. The second etch process is performed such that the first silicide layer 160 has a thinned portion 160a having a reduced thickness, as discussed previously with regard to FIGS. 22A and 22B. An implantation process S100 is performed to implant dopants into the thinned portions 160a of the first silicide layer 160 and an anneal process may then be performed to repair damage from the implantation process S100 on the exposed portion of the first silicide layer 160 to alter the silicide phase thereof. As a result, the thinned portion 160a and the un-etched portion 160b have different silicide phases. For example, the thinned portions of the first silicide layer 160 may undergo a C49-$TiSi_2$ phase to a $Ti_5Si_4$ phase transformation or a C54-$TiSi_2$ phase to a $Ti_5Si_4$ phase transformation.

The dopants during the implantation process S100 may include B. P. As, Sb, Ga, F, C, N, Ar, He, H, Cl, Si, Ge, the like, or a combination thereof. In some embodiments, after performing the implantation process S100 and the anneal process, the dopants may diffuse into the thinned portion 160a the epitaxial source/drain regions 152, 158 such that the thinned portion 160a of the epitaxial source/drain regions 152, 158 include the dopants. The un-etched portion 160b of the first silicide layer 160 is substantially un-doped. That is to say, the thinned portion 160a has a different dopant concentration than the un-etched portion 160b. In other words, the thinned portion 160a has a higher dopant concentration than the un-etched portion 160b. In some embodiments, the thinned portion 160a and the un-etched portion 160b have different grain sizes, crystal structures, or an amorphous structure.

Figure 32A:
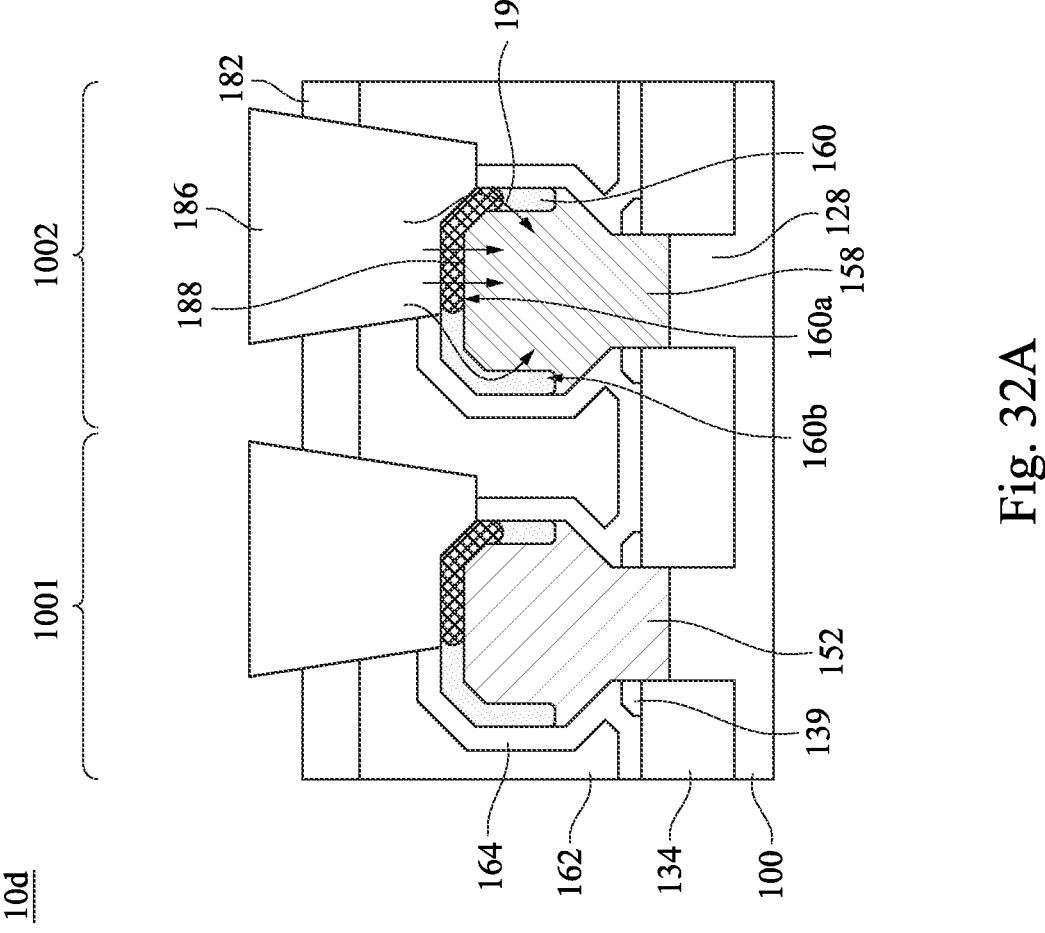
Figures 32B, 32C:
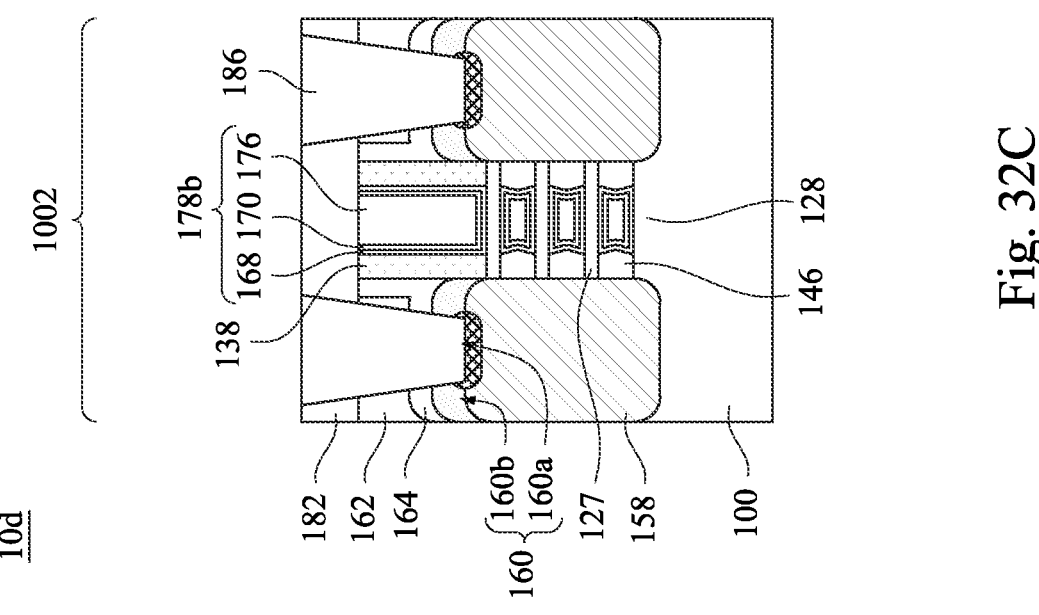

In FIGS. 32A-32C, one or more conductive materials fill into the contact holes 184 followed by a CMP process to remove excessive portions of the conductive materials, forming metal contacts 186, as discussed previously with regard to FIGS. 23A-23D. Due to the $Ti_5Si_4$ phase having a contact resistance lower than a contact resistance of the C49-$TiSi_2$ phase and a C54-$TiSi_2$ phase, the contact resistance of the first current path 188 between the metal contact 186 and the thinned portion 160a of the first silicide layer 160 can be reduced.

Figure 33B:
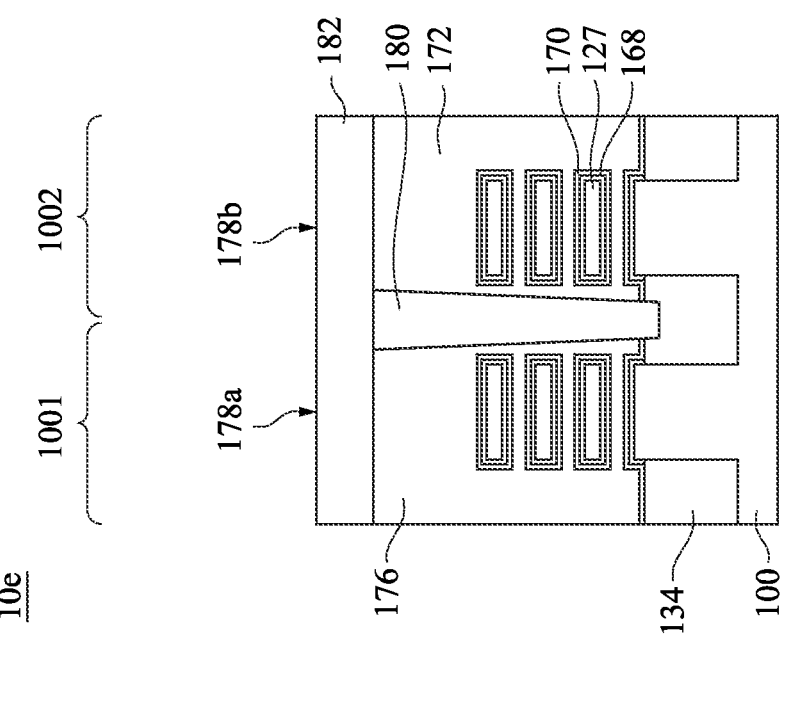
Figure 33A:
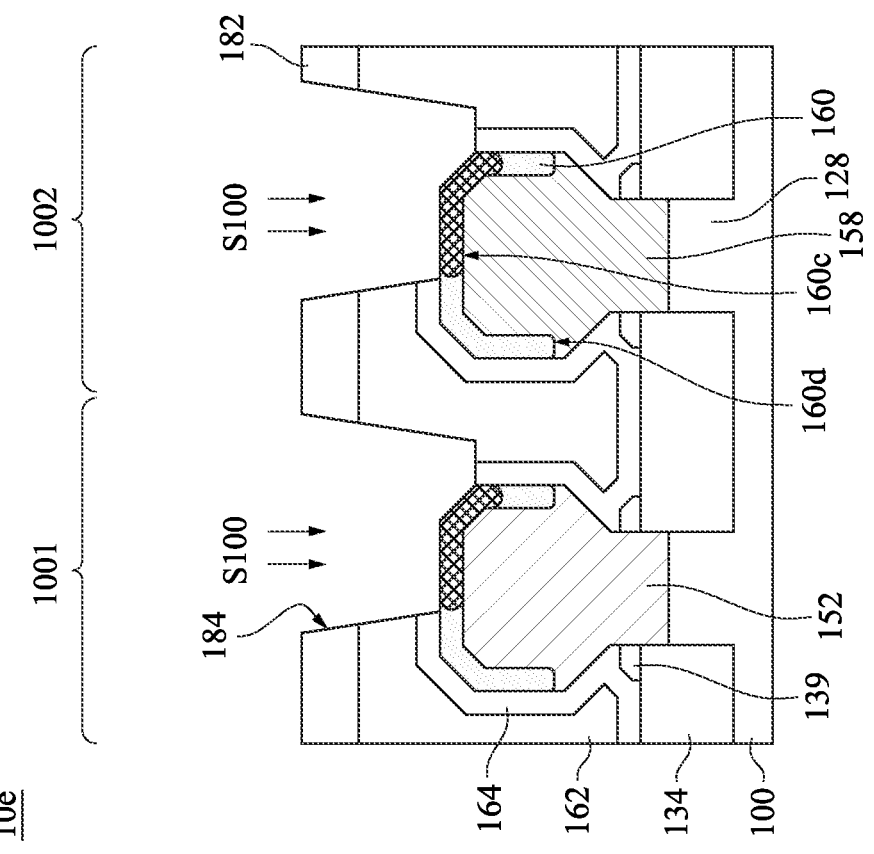

FIGS. 33A. 33B, 34A, and 34B show cross-sectional views of a nanosheet field-effect transistor (NSFET) device 10e at various stages of manufacturing, in accordance with an embodiment. FIGS. 33A and 33B illustrate the resulting structure after the contact holes 184 are formed. This embodiment is similar to the previous embodiment described in FIGS. 21A and 21B, except for the exposed first silicide layer 160 being implanted by an implantation process S100. The implantation process S100 is performed to implant dopants into an exposed portion of the first silicide layer 160 and an anneal process may then be performed to repair damage from the implantation process S100 on the exposed portion of the first silicide layer 160 to alter the silicide phase thereof. As a result, a doped region 160c is formed. The un-exposed region of the first silicide layer 160 is substantially un-doped, and thus the un-exposed portion can be referred to as an un-doped region 160d. The doped region 160c and the un-doped region 160d have different silicide phases. For example, the doped region 160c of the first silicide layer 160 may undergo a C49-$TiSi_2$ phase to a $Ti_5Si_4$ phase transformation or a C54-$TiSi_2$ phase to a $Ti_5Si_4$ phase transformation. The dopants during the implantation process may include B. P. As, Sb, Ga, F, C, N, Ar, He, H, Cl, Si, Ge, or the like. In some embodiments, after performing the implantation process S100 and the anneal process, the dopants may diffuse into the exposed region of the epitaxial source/drain regions 152, 158 such that the exposed region of the epitaxial source/drain regions 152, 158 include the dopants. That is to say, the doped region 160c has a different dopant concentration than the un-doped region 160d. In other words, the doped region 160c has a higher dopant concentration than the un-doped region 160d. In some embodiments, the doped region 160c and the un-doped region 160d have different grain sizes, crystal structures, or an amorphous structure.

Figure 34A:
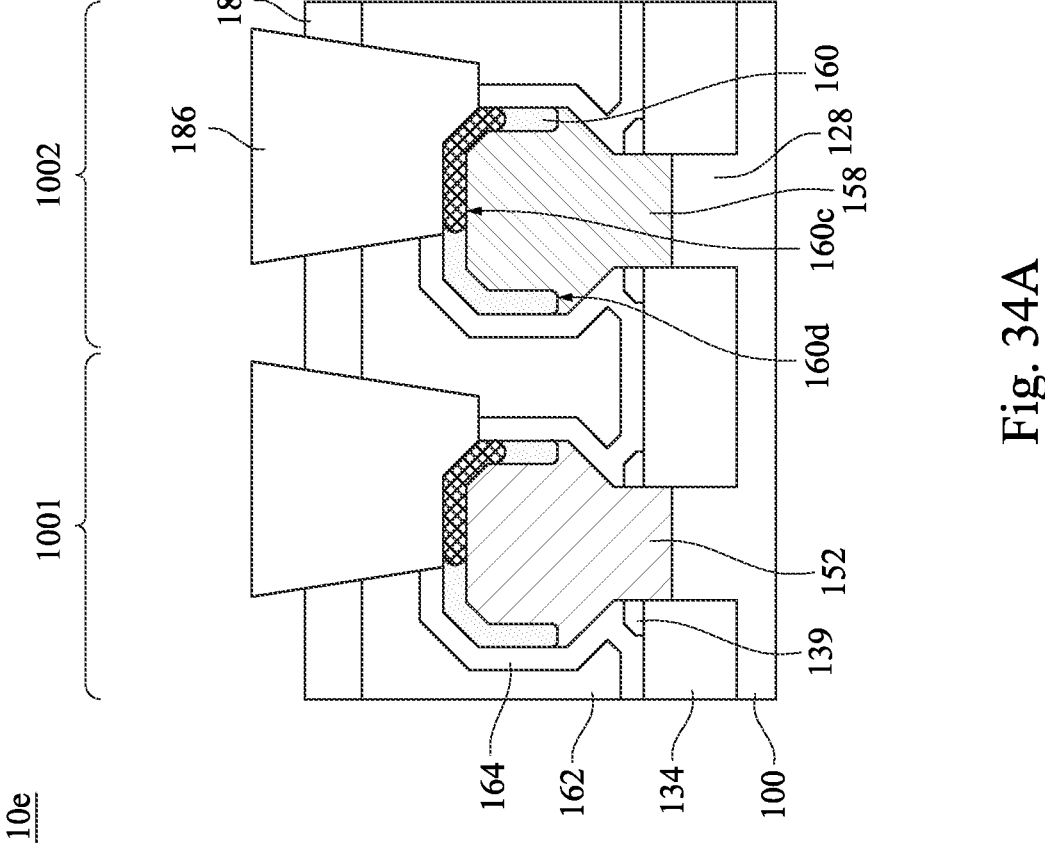
Figures 34B, 34C:
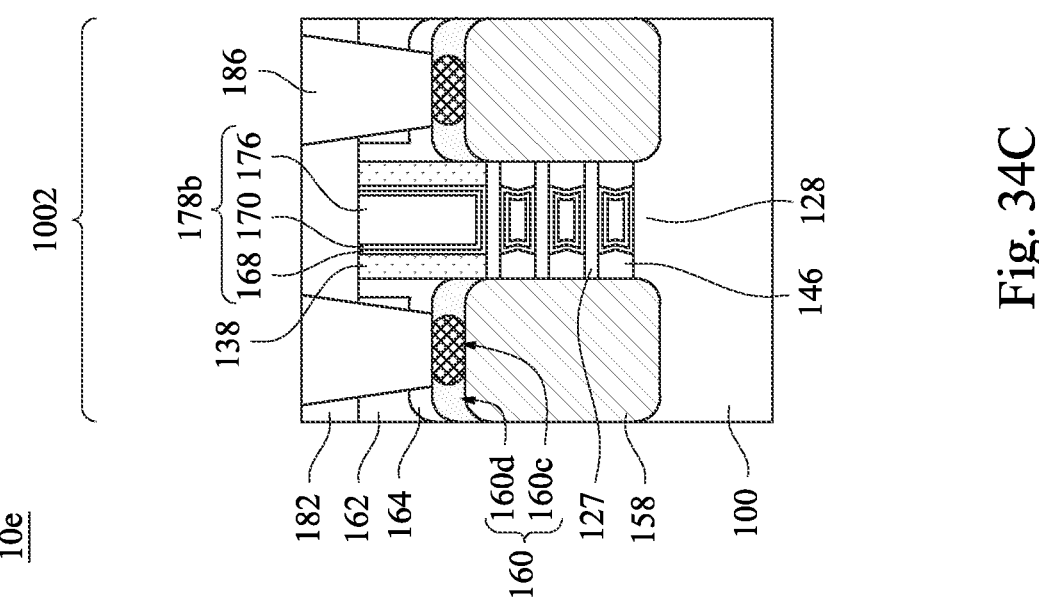

In FIGS. 34A-34C, one or more conductive materials fill into the contact holes followed by a CMP process to remove excessive portions of the conductive materials, forming metal contacts 186 as discussed previously with regard to FIGS. 23A-23D. Due to the $Ti_5Si_4$ phase having a contact resistance lower than a contact resistance of the C49-$TiSi_2$ phase and a C54-$TiSi_2$ phase, the contact resistance of the first current path 188 between the metal contact 186 and the doped region 160c of the first silicide layer 160 can be reduced.

Figure 35:
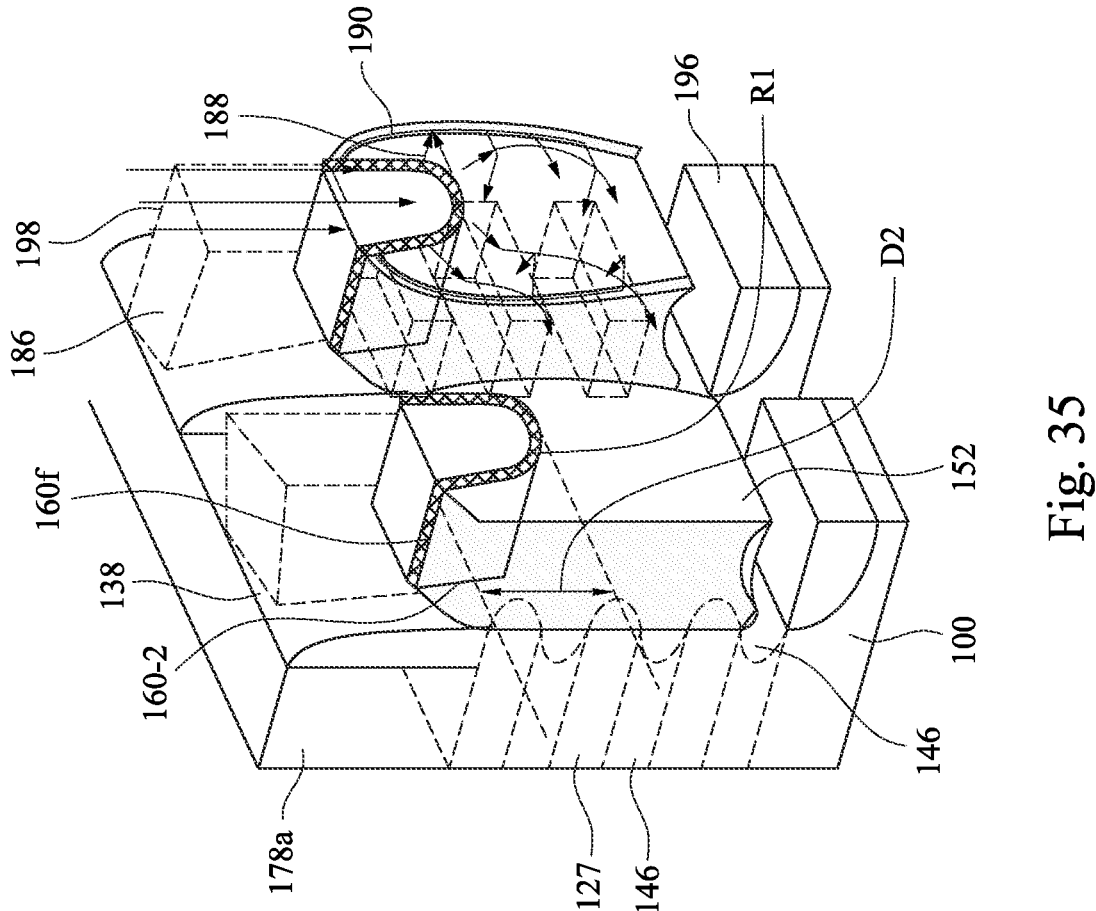
FIG. 35 is a perspective view of a nanosheet field-effect transistor (NSFET) device in accordance with an embodiment.

FIG. 35 is a perspective view of a nanosheet field-effect transistor (NSFET) device 10f in accordance with an embodiment. In some embodiments, a barrier structure 196 is disposed under the epitaxial source/drain regions 152 to provide an isolation of the epitaxial source/drain regions 152 from the substrate 100. Therefore, a leakage between adjacent epitaxial source/drain regions 152 can be reduced. A first silicide layer 160-2 covers a part of the top and the sidewall of the epitaxial source/drain regions 152 and 158. The first silicide layer 160-2 is similar to the first silicide layer 160 in FIG. 15D. The epitaxial source/drain regions 152 and 158 have a recessed portion R1. For example, the epitaxial source/drain regions 152 and 158 are recessed in a distance D2 toward the substrate 100 as discussed previously with regard to FIG. 28C. The recessed portion R1 is implanted by dopants, as discussed previously with regard to FIG. 31A, forming a doped region 160f. The first silicide layer 160-2 and the epitaxial source/drain regions 152 have a contact area greater than a contact area between the doped region 160f and the epitaxial source/drain regions 152. The metal contacts 186 are formed over the epitaxial source/drain regions 152 and 158 and are in contact with the doped region 160f. A current 198 is injected into the metal contact 186, and the current 198 would flow along a first current path 188 and a second current path 190. Due to the $Ti_5Si_4$ phase having a contact resistance lower than a contact resistance of the C49-$TiSi_2$ phase and a C54-$TiSi_2$ phase, the contact resistance of the first current path 188 between the metal contact 186 and the doped region 160f can be reduced. Due to a side portion and a corner portion of the first silicide layer 160-2 with an intact thickness and with the C49-$TiSi_2$ phase or the C54-$TiSi_2$ phase, which has low sheet resistance (Rs), the second current path 190 has a low sheet resistance.

Additional processing may be performed to finish fabrication of the device, as one of ordinary skill readily appreciates, thus details may not be repeated here. For example, another inter-layer dielectric (ILD) may be deposited over the ILD layer 182. Further, conductive lines and conductive vias may be formed extending through the additional ILD and/or the ILD layer 182 to electrically couple to the metal gate stacks 178a, 178b and the metal contacts 186 over epitaxial source/drain regions 152, 158.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by thinning the portion of the first silicide layer under the metal contact, a contact resistance of the first current path between the metal contact and the thinned portion of the first silicide layer is reduced. Another advantage is that due to the un-etched portion (i.e., the side portion and the corner portion of the first silicide layer) of the first silicide layer with the intact thickness, the second current path has a low sheet resistance. Yet another advantage is that by performing an implantation process to form a doped region in the first silicide layer to alter the phase thereof, the first silicide layer may undergo a C49-$TiSi_2$ phase to a $Ti_5Si_4$ phase transformation or a C54-$TiSi_2$ phase to a $Ti_5Si_4$ phase transformation such that the contact resistance of the first current path between the metal contact and the doped regions of the first silicide layer can be reduced.

In some embodiments, a method of forming a semiconductor device includes the following steps. A substrate is patterned to form a fin structure. The fin structure is recessed to form a recess in the fin structure. An epitaxial source/drain region is grown from the recess. A first silicide layer is formed on the epitaxial source/drain region. A first portion of the first silicide layer is thinned, while leaving a second portion of the first silicide layer un-thinned. A metal contact is formed in contact with the thinned first portion of the first silicide layer. In some embodiments, the metal contact has a bottommost surface in contact with the first silicide layer. In some embodiments, the method further includes doping the thinned first portion of the first silicide layer with a dopant and after doping the thinned first portion of the first silicide layer, annealing the first silicide layer. In some embodiments, the dopant comprises B, P, As, Sb, Ga, F, C, N, Ar, He, H, Cl, Si, Ge, or a combination thereof. In some embodiments, after annealing the first silicide layer, the thinned first portion of the first silicide layer has a $Ti_5Si_4$ phase. In some embodiments, after annealing the first silicide layer, the thinned first portion of the first silicide layer has a silicide phase different from a silicide phase of the un-thinned second portion of the first silicide layer. In some embodiments, thinning the first portion of the first silicide layer is performed such that the epitaxial source/drain region is exposed. In some embodiments, the method further includes forming a second silicide layer on the epitaxial source/drain region after thinning the first portion of the first silicide layer. In some embodiments, the second silicide layer has a silicide phase different from a silicide phase of the first silicide layer. In some embodiments, thinning the first portion of the first silicide layer is performed such that a portion of the epitaxial source/drain region is removed. In some embodiments, the un-thinned second portion of the first silicide layer is a side portion of the first silicide layer. In some embodiments, the metal contact has a bottom surface lower than a topmost position of the first silicide layer.

In some embodiments, a method of forming a semiconductor device includes the following steps. A multi-layer stack is formed on a substrate, in which the multi-layer stack comprises alternately stacked first semiconductor layers and second semiconductor layers. The multi-layer stack and the substrate are etched to form fin structures each comprising alternately stacked first nanostructures and second nanostructures. A dummy gate stack is formed across the fin structures. Epitaxial source/drain regions are formed on opposite sides of the dummy gate stack. A first silicide layer is formed on one of the epitaxial source/drain regions, in which the first silicide layer has a first silicide phase. An interlayer dielectric (ILD) layer is formed on the epitaxial source/drain regions and the dummy gate stack. The first nanostructures are replaced with a meal gate stack. The ILD layer is etched to expose the first silicide layer. An implantation process is performed to the first silicide layer to form a doped region in the first silicide layer. The first silicide layer is annealed such that the doped region has a second silicide phase different from the first silicide phase. A metal contact is formed on the first silicide layer. In some embodiments, the second silicide phase has a contact resistance lower than a contact resistance of the first silicide phase. In some embodiments, the first silicide phase is a C49-$TiSi_2$ phase or a C54-$TiSi_2$ phase. In some embodiments, the second silicide phase is a $Ti_5Si_4$ phase. In some embodiments, during annealing the first silicide layer, the first silicide layer has a side portion having a silicide phase being substantially intact.

In some embodiments, a semiconductor device includes a fin structure protruding from a substrate, a gate stack crossing the fin structure, epitaxial source/drain regions on opposite sides of the gate stack, a first silicide layer covering a top of at least one of the epitaxial source/drain regions, a second silicide layer along a sidewall of the at least one of the epitaxial source/drain regions, in which the second silicide layer and the first silicide layer are different in thickness or in silicide phase, and a source/drain contact over the first silicide layer. In some embodiments, the first silicide layer and the second silicide layer have a thickness difference in a range from about 1 nm to about 5 nm. In some embodiments, the first silicide layer has a contact resistance lower than a contact resistance of the second silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   patterning a substrate to form a fin structure;
   recessing the fin structure to form a recess in the fin structure;
   growing an epitaxial source/drain region from the recess;
   forming a first silicide layer on the epitaxial source/drain region;
   thinning a first portion of the first silicide layer, while leaving a second portion of the first silicide layer un-thinned, wherein the first portion has a top surface lower than a top surface of the second portion; and
   forming a metal contact in contact with the thinned first portion of the first silicide layer.

2. The method of claim 1, wherein the metal contact has a bottommost surface in contact with the first silicide layer.

3. The method of claim 1, further comprising:
   doping the thinned first portion of the first silicide layer with a dopant; and
   after doping the thinned first portion of the first silicide layer, annealing the first silicide layer.

4. The method of claim 3, wherein the dopant comprises B, P, As, Sb, Ga, F, C, N, Ar, He, H, Cl, Si, Ge, or a combination thereof.

5. The method of claim 3, wherein after annealing the first silicide layer, the thinned first portion of the first silicide layer has a $Ti_5Si_4$ phase.

6. The method of claim 5, wherein after annealing the first silicide layer, the thinned first portion of the first silicide layer has a silicide phase different from a silicide phase of the un-thinned second portion of the first silicide layer.

7. The method of claim 1, wherein thinning the first portion of the first silicide layer is performed such that the epitaxial source/drain region is exposed.

8. The method of claim 7, further comprising:

forming a second silicide layer on the epitaxial source/ drain region after thinning the first portion of the first silicide layer.

9. The method of claim 8, wherein the second silicide layer has a silicide phase different from a silicide phase of the first silicide layer.

10. The method of claim 1, wherein thinning the first portion of the first silicide layer is performed such that a portion of the epitaxial source/drain region is removed.

11. The method of claim 1, wherein the un-thinned second portion of the first silicide layer is a side portion of the first silicide layer.

12. The method of claim 1, wherein the metal contact has a bottom surface lower than a topmost position of the first silicide layer.

13. A method of forming a semiconductor device, comprising:

forming a multi-layer stack on a substrate, wherein the multi-layer stack comprises alternately stacked first semiconductor layers and second semiconductor layers;

etching the multi-layer stack and the substrate to form fin structures each comprising alternately stacked first nanostructures and second nanostructures;

forming a dummy gate stack across the fin structures;

forming epitaxial source/drain regions on opposite sides of the dummy gate stack;

forming a first silicide layer on one of the epitaxial source/drain regions, wherein the first silicide layer has a first silicide phase;

forming an interlayer dielectric (ILD) layer on the epitaxial source/drain regions and the dummy gate stack;

replacing the first nanostructures with a metal gate stack;

etching the ILD layer to expose the first silicide layer;

thinning a first portion of the first silicide layer, while leaving a second portion of the first silicide layer un-thinned, wherein thinning the first portion of the first silicide layer is performed such that the epitaxial source/drain regions are exposed;

forming a second silicide layer on the epitaxial source/ drain regions having a second silicide phase different from the first silicide phase; and forming a metal contact on the first silicide layer.

14. The method of claim 13, wherein the second silicide phase has a contact resistance lower than a contact resistance of the first silicide phase.

15. The method of claim 13, wherein the first silicide phase is a $C49\text{-}TiSi_2$ phase or a $C54\text{-}TiSi_2$ phase.

16. The method of claim 13, wherein the second silicide phase is a $Ti_5Si_4$ phase.

17. The method of claim 13, wherein during annealing the first silicide layer, the first silicide layer has a side portion having a silicide phase being substantially intact.

18. A semiconductor device, comprising:

a fin structure protruding from a substrate;

a gate stack crossing the fin structure;

epitaxial source/drain regions on opposite sides of the gate stack;

a first silicide layer covering a top of at least one of the epitaxial source/drain regions, wherein the first silicide layer has a bottom surface lower than a top surface of the epitaxial source/drain regions;

a second silicide layer along a sidewall of the at least one of the epitaxial source/drain regions, wherein the second silicide layer and the first silicide layer are different in thickness or in silicide phase; and a source/drain contact over the first silicide layer.

19. The semiconductor device of claim 18, wherein the first silicide layer and the second silicide layer have a thickness difference in a range from about 1 nm to about 5 nm.

20. The semiconductor device of claim 18, wherein the first silicide layer has a contact resistance lower than a contact resistance of the second silicide layer.

* * * * *